(12) United States Patent
Yamada et al.

(10) Patent No.: US 10,937,979 B2
(45) Date of Patent: Mar. 2, 2021

(54) ORGANIC EL ELEMENT, AND DISPLAY DEVICE, IMAGING APPARATUS, LIGHTING DEVICE, AND MOVABLE BODY INCLUDING THE SAME

(71) Applicant: CANON KABUSHIKI KAISHA, Tokyo (JP)

(72) Inventors: Naoki Yamada, Inagi (JP); Itaru Takaya, Atsugi (JP); Jun Kamatani, Tokyo (JP); Hirokazu Miyashita, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/393,642

(22) Filed: Apr. 24, 2019

(65) Prior Publication Data

US 2019/0333968 A1   Oct. 31, 2019

(30) Foreign Application Priority Data

Apr. 26, 2018 (JP) .............................. JP2018-085874

(51) Int. Cl.
| | |
|---|---|
| *H01L 51/50* | (2006.01) |
| *H01L 27/32* | (2006.01) |
| *H01L 51/52* | (2006.01) |

(52) U.S. Cl.
CPC ........ *H01L 51/5004* (2013.01); *H01L 27/322* (2013.01); *H01L 51/5036* (2013.01); *H01L 51/5218* (2013.01); *H01L 51/5268* (2013.01); H01L 2251/552 (2013.01)

(58) Field of Classification Search
CPC ............ H01L 51/5004; H01L 51/5036; H01L 51/5218; H01L 27/322; H01L 2251/552
See application file for complete search history.

(56) References Cited

U.S. PATENT DOCUMENTS

| | | | |
|---|---|---|---|
| 7,091,843 B1 * | 8/2006 | Lal ........................... | B60Q 1/26 340/463 |
| 2002/0167268 A1 * | 11/2002 | Aruga ............... | G02F 1/133514 313/500 |
| 2005/0236553 A1 * | 10/2005 | Noto .................. | H01L 27/14621 250/208.1 |
| 2006/0121312 A1 * | 6/2006 | Yamada ................. | C09K 11/06 428/690 |
| 2007/0126681 A1 * | 6/2007 | Goden ................ | H01L 51/5012 345/92 |

(Continued)

FOREIGN PATENT DOCUMENTS

| | | |
|---|---|---|
| WO | 2008/120611 A1 | 10/2008 |
| WO | 2010/134350 A1 | 11/2010 |

*Primary Examiner* — Feifei Yeung Lopez
(74) *Attorney, Agent, or Firm* — Canon U.S.A., Inc., IP Division

(57) ABSTRACT

An organic EL element includes a first electrode, a first luminescent layer, a second luminescent layer, a third luminescent layer, and a second electrode, in this order. The second luminescent layer is in contact with the first luminescent layer and the third luminescent layer. The first luminescent layer contains a red dopant and a first host material. The second luminescent layer contains a blue dopant and a second host material, and the third luminescent layer contains a green dopant and the second host material. The second host material is different from the first host material.

21 Claims, 8 Drawing Sheets

(56) References Cited

U.S. PATENT DOCUMENTS

2007/0228938 A1* 10/2007 Hatwar ............... H01L 27/3213
313/504
2011/0160170 A1* 6/2011 Njar ....................... A61K 31/58
514/171
2015/0053945 A1* 2/2015 Kim .................... H01L 51/0094
257/40

* cited by examiner

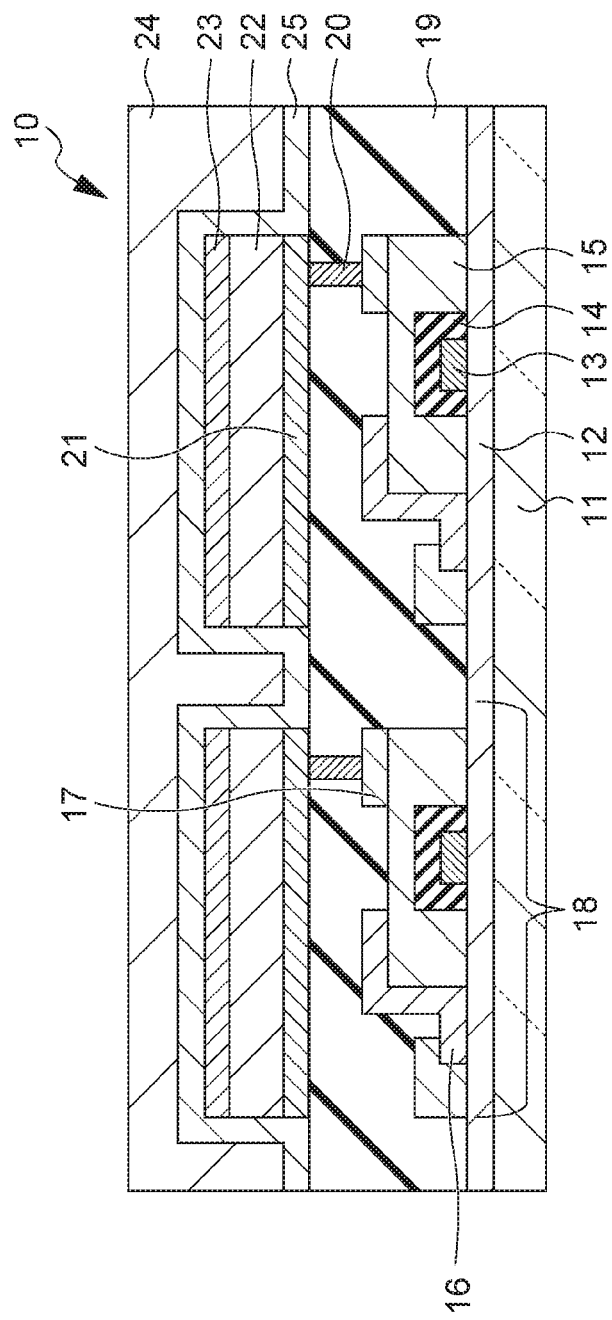

ORGANIC EL ELEMENT, AND DISPLAY DEVICE, IMAGING APPARATUS, LIGHTING DEVICE, AND MOVABLE BODY INCLUDING THE SAME

BACKGROUND OF THE INVENTION

Field of the Invention

The present disclosure relates to a low-voltage, long-life organic EL element and to a display device, an imaging apparatus, a lighting device, and a movable body including the organic EL element.

Description of the Related Art

Full-color light-emitting arrays including organic EL elements have been developed. For manufacturing a full-color light-emitting array, luminescent layers may be provided for each pixel (element), or organic EL elements each of which includes a white light-emitting luminescent layer provided with any of a red, a green, and a blue color filter may be used. In an organic EL element, luminescent material capable of emitting three colors (red, green, and blue) suitable for the color filter is used.

International Publication No. WO2008/120611 (hereinafter referred to as PTL 1) discloses a white light-emitting element including a green, a red, and a blue luminescent layer that are stacked over an anode in this order. International Publication No. WO2010/134350 (hereinafter referred to as PTL 2) discloses an organic EL element including a red, a blue, and a green luminescent layer that are stacked in this order, wherein the blue and the green luminescent layer contain the same host material, while the red luminescent layer contains a different host material. In this organic EL element, the red luminescent layer and the blue luminescent layer are provided with an intervening layer therebetween for a favorable balance in the emission of red, green, and blue.

The organic EL element disclosed in PTL 1, which is intended for white-light emission, can be further improved by changing the stacking order of the luminescent layers, and the properties of the organic EL element disclosed in PTL 2, which includes a non-luminescent layer between two luminescent layers, can be further improved.

SUMMARY OF THE INVENTION

Accordingly, the present disclosure provides a long-life organic EL element that can operate at a low voltage and emit balanced white light.

An organic EL element according to an embodiment of the present disclosure includes an anode acting as a light-reflective electrode, a first luminescent layer containing a red dopant, a second luminescent layer containing a blue dopant, a third luminescent layer containing a green dopant, and a cathode, in this order. The second luminescent layer is disposed in contact with the first luminescent layer and the third luminescent layer.

In this structure, the first luminescent layer contains a first host material, and the second luminescent layer and the third luminescent layer each contain a second host material different from the first host material.

Further features of the present disclosure will become apparent from the following description of exemplary embodiments with reference to the attached drawings.

BRIEF DESCRIPTION OF THE DRAWINGS

FIG. 3 is a schematic sectional view of a display device including the organic EL elements according to an embodiment of the present disclosure.

DESCRIPTION OF THE EMBODIMENTS

An organic EL element of the present disclosure includes an anode acting as a light-reflective electrode, a first luminescent layer, a second luminescent layer, a third luminescent layer, and a cathode, in this order. The second luminescent layer is disposed in contact with the first luminescent layer and the third luminescent layer. The first luminescent layer contains a red dopant, the second luminescent layer contains a blue dopant, and the third luminescent layer contains a green dopant. That is, a red luminescent layer, a blue luminescent layer, and a third luminescent layer are disposed in this order. In this structure, the first luminescent layer contains a first host material, and the second luminescent layer and the third luminescent layer each contain a second host material different from the first host material. Hence, the luminescent layers capable of emitting short-wavelength light contain the same host material, while the luminescent layer capable of emitting long-wavelength light contains a different host material. The energy difference from the host material to the dopant does not contribute to light emission. It is, therefore, beneficial to have a small difference in band gap between the host material and the dopant. Since the dopant used in the red luminescent layer has a large difference in band gap from the host material used in the blue luminescent layer, energy loss between the luminescent layers increases. It is, therefore, beneficial for high luminous efficiency of the long-wavelength light-emitting luminescent layer to use a host material having a band gap suitable for long-wavelength emission.

On the other hand, the energy of the green luminescent layer is closer than that of the red luminescent layer to that of the blue luminescent layer. Accordingly, luminous efficiency does not decrease much, even though the same host material is used.

Figure 1:
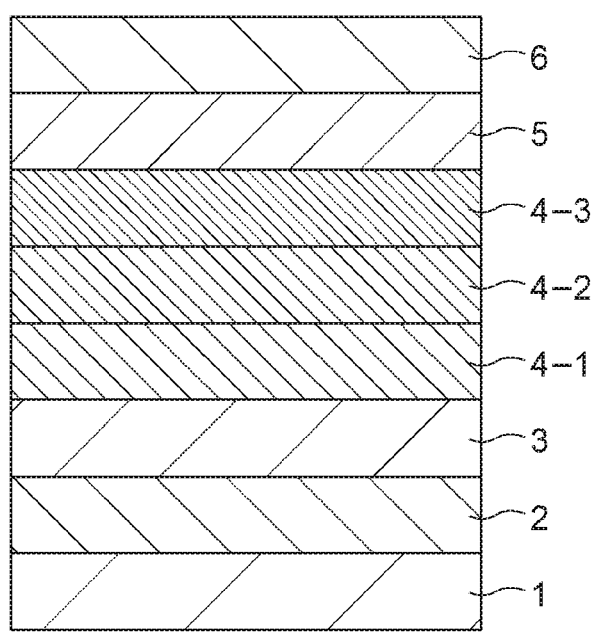
FIG. 1 is a schematic sectional view of an organic EL element according to an embodiment of the present disclosure.

FIG. 1 is a schematic sectional view of an organic EL element according to an embodiment of the present disclosure. The organic EL element shown in FIG. 1 includes an anode 2, a hole transport layer 3, a first luminescent layer 4-1, a second luminescent layer 4-2, a third luminescent layer 4-3, an electron transport layer 5, and a cathode 6, in this order, on a substrate 1. In the arrangement of the first luminescent layer 4-1, the second luminescent layer 4-2, and the third luminescent layer 4-3, the second luminescent layer is in contact with the first luminescent layer and the third luminescent layer. In other words, there is no organic compound layer such as a charge barrier layer between any two luminescent layers. In the description of the present disclosure, a structure in which layers in contact with each other is such that the layers do not have any other layers therebetween.

The first luminescent layer 4-1 contains a first host material and a red dopant capable of emitting red light; the second luminescent layer 4-2 contains a second host material and a blue dopant capable of emitting blue light; and the third luminescent layer 4-3 contains the second host material and a green dopant capable of emitting green light. The first host material is different from the second host material.

The term "luminescent layer" used herein refers to one of the organic compound layers between a pair of electrodes that is operable to emit light. The term "host material" in reference to the material contained in a luminescent layer refers to the constituent accounting for the largest proportion in weight of the luminescent layer. More specifically, the content of the host material in a luminescent layer is 50% by weight or more relative to the total weight of the luminescent layer.

The dopant in a luminescent layer accounts for a smaller weight proportion than the host material. More specifically, the dopant in a luminescent layer is a luminescent material (luminescent dopant) with a content of less than 50% by weight.

The red dopant enables red light to be emitted. This principle is also applicable to the other colors.

Blue emission or blue luminescence is emission of light having a maximum emission peak at a wavelength in the range of 430 nm to 480 nm; green emission or green luminescence is emission of light having a maximum emission peak at a wavelength in the range of 490 nm to 540 nm; and red emission or red luminescence is emission of light having a maximum emission peak at a wavelength in the range of 570 nm to 650 nm. The term "peak" mentioned herein refers to a local maximum in an emission spectrum.

The structure shown in FIG. 1 may further include a hole injection layer between the anode 2 and the hole transport layer 3 and an electron blocking layer between the hole transport layer 3 and the luminescent layers. Furthermore, a hole blocking layer may be disposed between the luminescent layers and the electron transport layer 5, and an electron injection layer may be disposed between the electron transport layer 5 and the cathode 6. The hole injection layer, the electron blocking layer, the hole blocking layer, and the electron injection layer are optional layers that may be provided as needed.

In the description of the present disclosure, highest occupied molecular orbital (HOMO) energy and lowest unoccupied molecular orbital (LUMO) energy are each a value with respect to the vacuum level and, in the case of a molecule, the HOMO energy and the LUMO energy are typically negative. Comparing HOMO energy and LUMO energy in the present disclosure, a small HOMO or LUMO may be expressed using "deep", "having a large absolute value", "low", or "far from the vacuum level", or the like; and a large HOMO or LUMO may be expressed using "shallow", "having a small absolute value", "high", or "close to the vacuum level".

In the description of molecular structures and HOMO and LUMO energies used herein, values obtained by a molecular orbital calculation using density functional theory (DFT), which is widely used, are used. The functional use is B3LYP, and the basis function is 6-31G*. The following is used for the molecular orbital calculation: Gaussian 09 (Gaussian 09, Revision C.01, M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery, Jr., J. E. Peralta, F. Ogliaro, M. Bearpark, J. J. Heyd, E. Brothers, K. N. Kudin, V. N. Staroverov, T. Keith, R. Kobayashi, J. Normand, K. Raghavachari, A. Rendell, J. C. Burant, S. S. Iyengar, J. Tomasi, M. Cossi, N. Rega, J. M. Millam, M. Klene, J. E. Knox, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas, J. B. Foresman, J. V. Ortiz, J. Cioslowski, and D. J. Fox, Gaussian, Inc., Wallingford Conn., 2010). This calculation is widely used.

In the Examples described later herein, values obtained by the molecular orbital calculation are compared with measured values to verify the certainty of the calculated values.

The organic EL element disclosed herein is long-life and can operate at a low voltage because of the following characteristic features:

(1) The anode, the red luminescent layer, the blue luminescent layer, the green luminescent layer, and the cathode are disposed in this order.
(2) The three luminescent layers are adjacent to each other.
(3) The first luminescent layer contains a first host material, and the second and the third luminescent layer each contain a second host material.

These features will now be described in detail.
(1) The anode, the red luminescent layer, the blue luminescent layer, the green luminescent layer, and the cathode are disposed in this order.

The red luminescent layer, that is, the luminescent layer containing a red dopant, is disposed closer than the other luminescent layers to the anode. The red dopant has a narrower band gap than the other dopants and is, accordingly, more likely than the luminescent materials for other colors to easily trap electrons. Therefore, if the red luminescent layer is located close to the cathode, electrons are trapped in the red luminescent layer and are unlikely to be transferred to the anode from the red luminescent layer. Consequently, the intensity of green emission and the intensity of blue emission are reduced. By providing the red luminescent layer closer than the other luminescent layers to the anode, electrons are more easily supplied to the green luminescent layer and the blue luminescent layer, thus reducing the driving voltage of the element.

The anode may be a reflective electrode. In this instance, the green luminescent layer and the blue luminescent layer may have a positional relation where the blue luminescent layer is located closer to the anode. Such a positional relation enables the optical interference distance from the reflective electrode to be adjusted for both the blue luminescent layer for short-wavelength emission and the green luminescent layer for emission having a longer wavelength than the blue emission. Interference with the light reflected from the reflective electrode increases light extraction efficiency, enabling the element to emit light at a low voltage.

(2) The three luminescent layers are adjacent to each other.

In the embodiment shown in FIG. 1, the arrangement of the luminescent layers is such that the second luminescent layer 4-2 is in contact with the first luminescent layer 4-1 and the third luminescent layer 4-3. In other words, the three luminescent layers are adjacent to each other. There is no intervening layer, such as a charge barrier layer, between any two luminescent layers. Such an arrangement of the luminescent layers leads to a reduced driving voltage. In such an arrangement, an increase in voltage caused by the transfer of the charges (holes and electrons) in the luminescent layers to the energy level of the intervening layer does not occur.

Figure 2A:
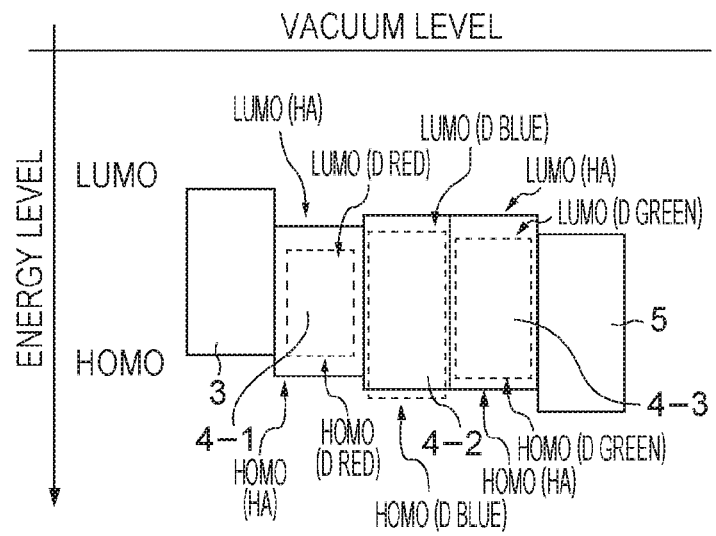
FIG. 2A is a schematic diagram illustrating the energy levels around the luminescent layers of an organic EL element according to an embodiment of the present disclosure.
Figure 2B:
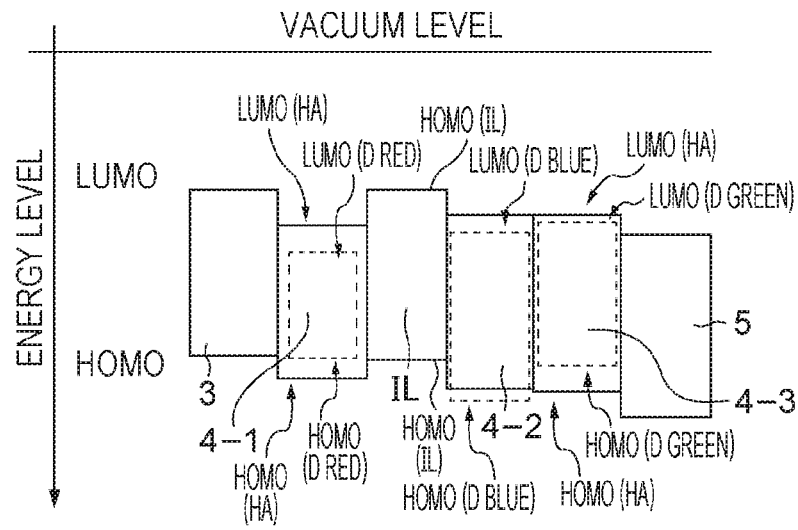
FIG. 2B is a schematic diagram illustrating the energy levels around the luminescent layers of a known organic EL element.
Figure 2C:
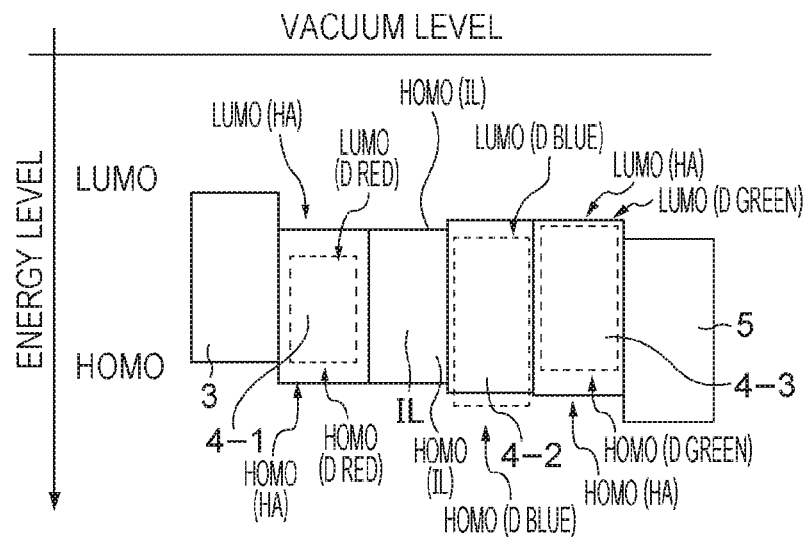
FIG. 2C is a schematic diagram illustrating the energy levels around the luminescent layers of another known organic EL element.

FIGS. 2A to 2C are each an energy diagram schematically illustrating the energy levels around luminescent layers of an organic EL element. FIG. 2A is a schematic energy diagram of the energy levels around luminescent layers of the organic EL element according to an embodiment of the present embodiment.

FIG. 2B is a schematic energy diagram of the energy levels around luminescent layers of a known organic EL element. The driving voltage of organic EL elements provided with a charge barrier layer (IL) as shown in FIG. 2B is high. This is because the LUMO level of the charge barrier layer is shallow. The charge barrier layer thus acts as a barrier to block electrons that are to be injected from the blue luminescent layer into the red luminescent layer. More specifically, a difference in LUMO energy when electrons are transferred to the charge barrier layer from the blue luminescent layer acts as a barrier. Similarly, the HOMO level of the charge barrier layer is deep. Accordingly, the charge barrier layer acts as a barrier to block holes that are to be injected from the red luminescent layer into the blue luminescent layer, thus increasing the driving voltage of the element.

FIG. 2C is also a schematic energy diagram of the energy levels around luminescent layers of another known organic EL element. The driving voltage of organic EL elements provided with a charge barrier layer (IL) as shown in FIG. 2C is higher than that of organic EL elements not having a charge barrier layer. In the case of the element shown in FIG. 2C, electron injection into the red luminescent layer from the blue luminescent layer is easier than the electron injection in the case shown in FIG. 2B, but hole injection into the blue luminescent layer from the red luminescent layer has a barrier, and the hole transfer distance increases.

Thus, the arrangement in which the three luminescent layers are adjacent to each other can achieve an organic EL element that can operate at a low voltage.

(3) The first luminescent layer contains a first host material, and the second and the third luminescent layer each contain a second host material.

The organic EL element of the present disclosure has three luminescent layers, the first to the third luminescent layer. The first luminescent layer 4-1 contains a first host material and a red dopant capable of emitting red light; the second luminescent layer 4-2 contains a second host material and a blue dopant capable of emitting blue light; and the third luminescent layer 4-3 contains the second host material and a green dopant capable of emitting green light. The first host material is different from the second host material.

When the host materials of the second and the third luminescent layer are the same, the driving voltage of the organic EL element is reduced. This is because luminescent layers containing the same host material do not have a charge injection barrier therebetween.

However, if the same host material is used in all the three luminescent layers to suppress a voltage increase, unbalanced white-light emission may be produced.

For example, in a structure including the first luminescent layer for red emission and the second and the third luminescent layer for blue and green emission, the same host material can be used in the second and the third luminescent layer. However, if the host material of the blue luminescent layer is used in the first luminescent layer, energy transfer efficiency from the host material to the red dopant is reduced, and, thus, the efficiency of red emission is reduced.

The reason for this is as described below. In the organic EL element of the present disclosure, energy transfer from the host material occurs based on the Förster mechanism. In energy transfer based on the Förster mechanism, an overlap between the emission spectrum of the host material and the emission spectrum of the dopant is taken into consideration. Since the dopant for blue emission has a maximum absorption peak in a wavelength range of 320 nm to 480 nm, the host material in the blue luminescent layer is required to have an emission peak in a range of 320 nm to 480 nm. Since the maximum absorption peak of the dopant for red emission is in a wavelength range of 490 nm to 650 nm, the host material in the red luminescent layer is required to have an emission peak in a range of 490 nm to 650 nm. When the emission peaks satisfy such requirements, energy is efficiently transferred.

It is however difficult to satisfy both the requirement for the host material of the blue luminescent layer and the requirement for the host material of the red luminescent layer. It is, therefore, beneficial for the host material in the blue luminescent layer to be different from the host material of the red luminescent layer.

In an embodiment, the host material of the red luminescent layer may have an emission peak in the range of 490 nm to 650 nm from the viewpoint of increasing the efficiency of emission from the red dopant. Hence, the band gap of the host material of the red luminescent layer is smaller than that of the blue and the green host material.

Also, since the dopant for green emission has a maximum absorption peak in a wavelength range of 430 nm to 540 nm, the host material in the green luminescent layer is required to have an emission peak in a range of 320 nm to 480 nm. Thus, since the wavelength range of the required emission peak of the green luminescent layer overlaps that of the blue luminescent layer, the same host material can be used in the blue luminescent layer and the green luminescent layer.

Thus, the first host material used in the red luminescent layer is different from the second host material used in the blue and the green luminescent layer. In some embodiments, the band gap of the first host material is smaller than that of the second host material.

Although energy transfer has been described above using emission peaks of the host materials. The host materials do not necessarily emit light in the organic EL element, and an emission peak mentioned herein is a physical property of a material.

In some embodiments, the organic EL element may satisfy the following relationships in addition to the above-described characteristic features (1) to (3):

(4) LUMO(second host)>LUMO(first host), wherein LUMO(first host) represents the LUMO energy of the first host material, and LUMO(second host) represents the LUMO energy of the second host material.

In the organic EL element of the present disclosure, as described in feature (3), the first host material in the red luminescent layer is different from the second host material used in the blue and the green luminescent layer so that the red dopant can function efficiently emit light, and the band gap of the first host material is smaller than that of the second host material.

In some embodiments of the organic EL element of the present disclosure, the LUMO level of the first host material is deeper than the LUMO level of the second host material. In such an instance, electron injection into the red luminescent layer from the blue luminescent layer does not have a barrier.

Also, the HOMO level of the first host material may be shallower than the HOMO level of the second host material. In this instance, the barrier of hole injection into the first luminescent layer from the anode decreases. Consequently, the driving voltage of the element is reduced.

(5) (LUMO(blue dopant)−LUMO(second host))>(HOMO(blue dopant)−HOMO(second host)); and
(LUMO(green dopant)−LUMO(second host))>(HOMO(green dopant)−HOMO(second host)), wherein LUMO(blue dopant) represents the LUMO energy of the blue dopant, HOMO(blue dopant) represents the HOMO energy of the blue dopant, LUMO(green dopant) represents the LUMO energy of the green dopant, HOMO(green dopant) represents the HOMO energy of the green dopant, LUMO(second host) represents the LUMO energy of the second host material, and HOMO(second host) represents the HOMO energy of the second host material.

These relationships imply that the blue luminescent layer and the green luminescent layer act to trap electrons.

When the LUMO energy of the dopant is lower than the LUMO energy of the host material in a luminescent layer, the luminescent layer becomes likely to trap electrons, and the tendency to trap electrons increases as the LUMO energy of the dopant decreases. Also, when the HOMO energy of the dopant is higher than the HOMO energy of the host material in a luminescent layer, the luminescent layer acts to trap holes.

In a luminescent layer, the band gap of the dopant is narrower than the band gap of the host material for efficient energy transfer from the host material to the dopant. In a luminescent layer, the host material and the dopant thus have a difference in LUMO energy and in HOMO energy therebetween, causing either a hole trap or an electron trap.

Charges (holes and electrons) in a luminescent layer move in the luminescent layer between the energy levels of the host material and the dopant. In other words, the charges in the luminescent layer moves within the layer while being repetitively trapped by or released from the host material or the dopant. At this time, the larger the difference in HOMO energy or LUMO energy between the host material and the dopant, the lower the mobility of the charges.

In some embodiments of the organic EL element, the blue luminescent layer and the green luminescent layer may act to trap electrons. Electron-trapping luminescent layers are not much affected by the hole trap and accordingly tend to transport holes. Such a characteristic to transport holes may be referred to as hole mobility.

In the organic EL element satisfying (3) and (4), there is a hole injection barrier but no electron injection barrier between each luminescent layer and the adjacent luminescent layer, as shown in FIG. 2A. Accordingly, from the viewpoint of bringing electron injection and hole injection into balance to emit red, green, and blue light in balance, hole supply to the blue and the green luminescent layer may be increased. In this regard, it is beneficial to efficiently transfer holes that have been injected into the blue luminescent layer to the green luminescent layer without being trapped in the blue luminescent layer.

It is, therefore, beneficial for the blue luminescent layer to exhibit high performance of hole transport and, accordingly, that the above energy relationships hold true. Thus, the organic EL element of the present disclosure emits red, blue, and green light in balance.

If holes injected into the green luminescent layer from the blue luminescent layer are trapped in the green luminescent layer, excitons may be concentrated at the interface of the green luminescent layer with the blue luminescent layer, thereby reducing the durability of the element. Beneficially, the holes are dispersed in the green luminescent layer. It is, therefore, beneficial for the green luminescent layer to also exhibit high performance of hole transport.

(6) (LUMO(red dopant)−LUMO(first host))>(HOMO(red dopant)−HOMO(first host)), wherein LUMO(red dopant) represents the LUMO energy of the red dopant, HOMO(red dopant) represents the HOMO energy of the red dopant, LUMO(first host) represents the LUMO energy of the first host material, and HOMO(first host) represents the HOMO energy of the first host material.

In the organic EL element of the present disclosure, the red luminescent layer, or the first luminescent layer, is closer than the other luminescent layers to the anode. No luminescent layer is closer than the first luminescent layer to the anode; hence, electrons are not transferred toward the anode from the first luminescent layer. If electrons are transferred to the anode, the durability of the element may be reduced.

From the viewpoint of hindering electrons from being transferred to the anode from the first luminescent layer, the electron trapping performance of the first luminescent layer may be enhanced. It is beneficial to satisfy the relationship: (LUMO(red dopant)−LUMO(first host))>(HOMO(red dopant)−HOMO(first host)), that is, it is beneficial that the difference in LUMO energy between the red dopant and the first host material is larger than the difference in HOMO energy between the red dopant and the first host material. By satisfying this relationship, the first luminescent layer becomes likely to trap electrons. When the first luminescent layer can easily trap electrons, the probability of recombination of the electrons injected into the first luminescent layer increases and, accordingly, luminous efficiency increases.

From the viewpoint of enhancing the electron trapping performance of the first luminescent layer, the relationship (LUMO(red dopant)−LUMO(first host))<0.1 eV is beneficial. Hence, the LUMO energy of the red dopant is beneficially lower than the LUMO energy of the first host material by 0.1 eV or more, more beneficially 0.3 eV or more.

(7) HOMO(blue dopant)<HOMO(green dopant)

In some embodiments of the organic EL element of the present disclosure, the blue and the green luminescent layer are more likely to trap holes than electrons, as described in feature (5). Furthermore, the green luminescent layer may be more likely than the blue luminescent layer to trap holes. From the viewpoint of recombining all the holes injected into the green luminescent layer to form excitons without injection into the layer closer to the cathode and adjacent to the green luminescent layer, the hole trapping performance of the green luminescent layer may be higher than that of the blue luminescent layer, satisfying the relationship: HOMO (blue dopant)<HOMO(green dopant).

Furthermore, from the viewpoint of hindering holes from being injected toward the cathode side from the third luminescent layer, that is, from the viewpoint of making holes more likely to remain in the third luminescent layer, the HOMO energy of the organic compound layer adjacent to the third luminescent layer and between the third luminescent layer and the cathode may be lower than the HOMO energy of the second host material. In some embodiments, the HOMO energy of the organic compound layer may be lower than the HOMO energy of the second host material by 0.1 eV or more, or 0.3 eV or more.

(8) The blue, green, and red dopants are each a compound having a condensed ring including a 5-membered ring.

The dopants used in the organic EL element of the present disclosure are not particularly limited but may have a condensed ring including a 5-membered ring having an electron-withdrawing structure, such as a fluoranthene structure, in view of electron transporting performance as described above. Such a compound has a low LUMO energy. Consequently, the difference in LUMO energy between the dopant and the host material increases and, accordingly, electron trapping performance is enhanced.

Beneficially, the dopants do not have an electron-donating substituted amino group. A dopant having a substituted amino group tends to have a high LUMO energy and may not be able to trap electrons sufficiently.

In view of binding stability, it is also beneficial that the dopants do not have a substituted amino group with a nitrogen-carbon single bond. A stable bond may be a carbon-carbon bond, a carbon-hydrogen bond, or a carbon-nitrogen triple bond.

When the dopant in each luminescent layer has a condensed ring including a 5-membered ring and no substituted amino group, the luminescent layer can sufficiently trap electrons. In addition, since the material itself is stable, the organic EL element can be highly durable.

The compound having a condensed ring including a 5-membered ring will now be described. Fluoranthene compounds exemplified below are condensed polycyclic compounds having a fluoranthene skeleton with a condensed ring. Exemplary compounds having a condensed ring including a 5-membered ring include the following condensed polycyclic compounds FF1 to FF30.

In some embodiments, dopants having a structure formed by condensing two or more fluoranthene molecules may be used from the viewpoint of enhancing the performance of electron withdrawing and electron trapping. More specifically, the dopants may be selected from among the skeletons denoted by FF7 to FF13, FF16 to FF20, and FF23 to FF30.

FF1
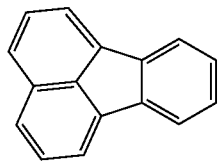

FF2
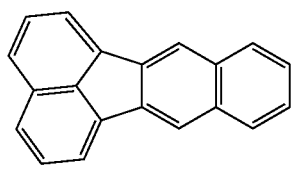

FF3
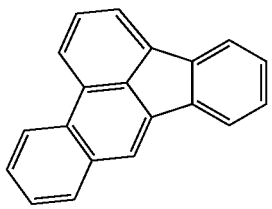

FF4
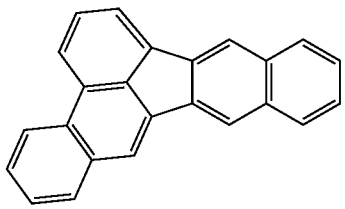

FF5
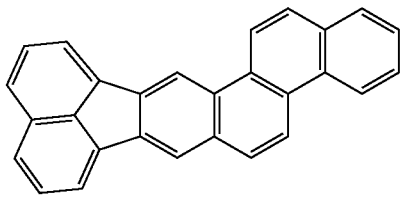

FF6
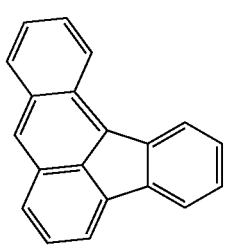

FF7
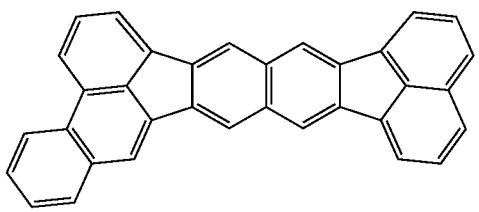

FF8
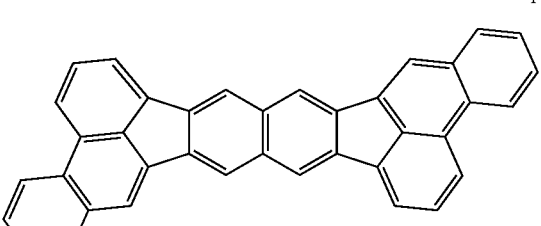

FF9
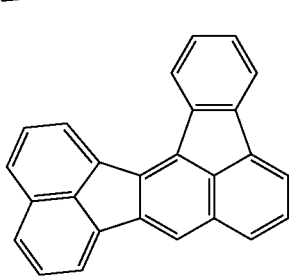

FF10
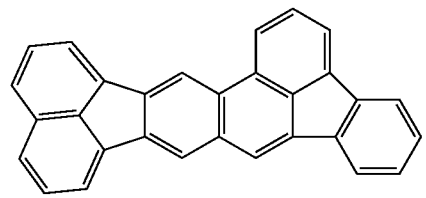
FF11
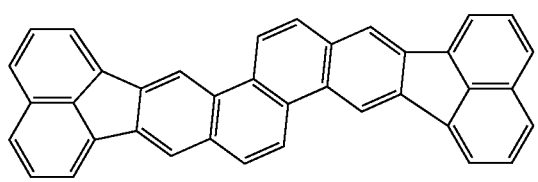
FF12
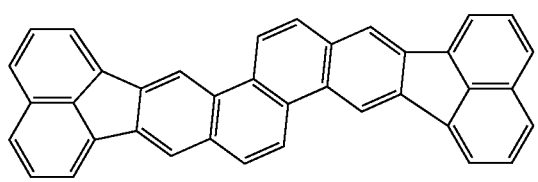
FF13
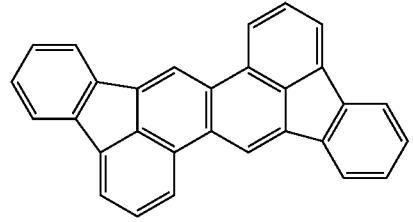
FF14
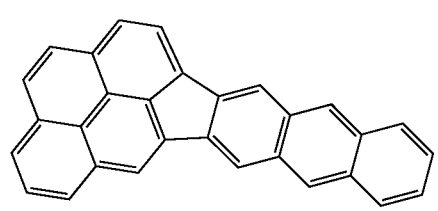
FF15
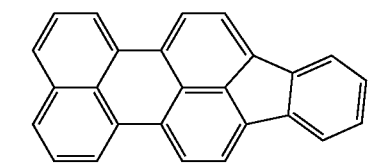
FF16
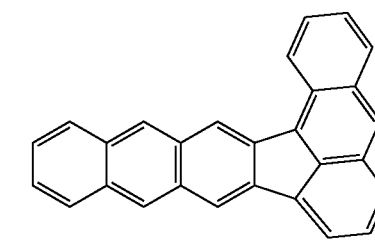
FF17
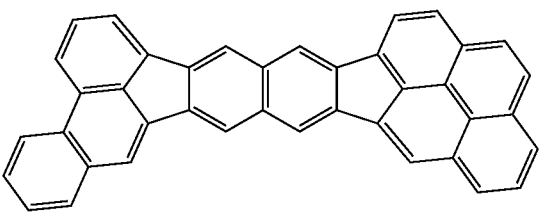
FF18
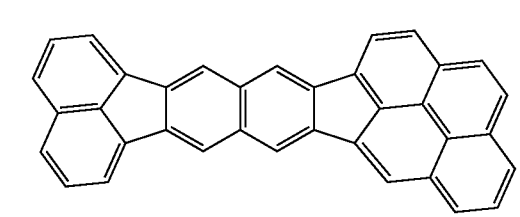
FF19
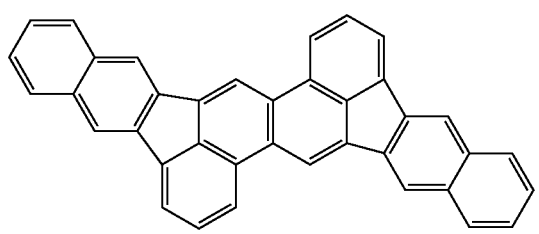
FF20
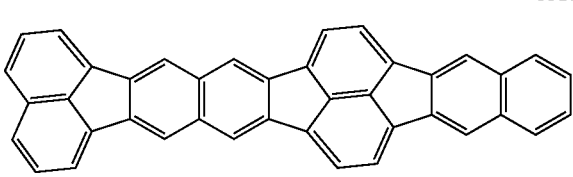
FF21
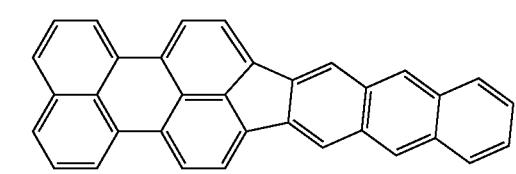
FF22
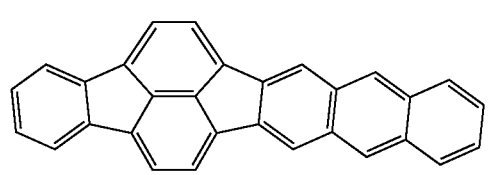
FF23
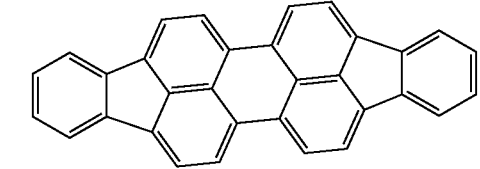
FF24

-continued

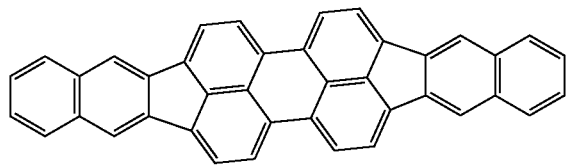
FF25

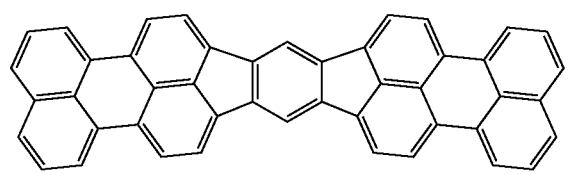
FF26

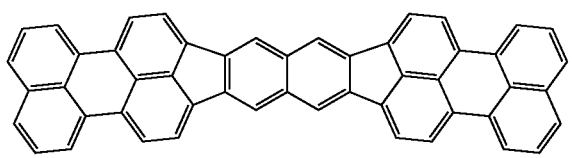
FF27

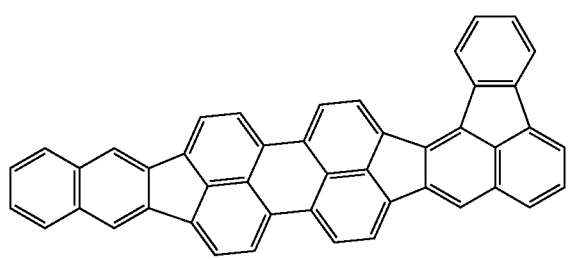
FF28

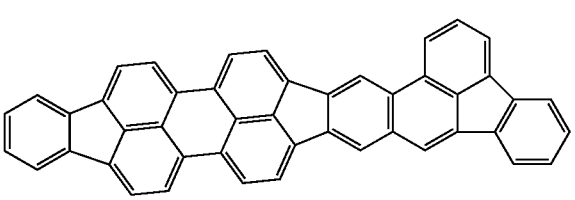
FF29

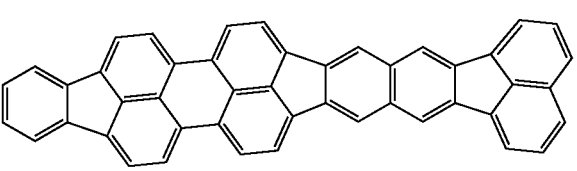
FF30

(9) Each host material consists of at least one hydrocarbon.

In the organic EL element according to an embodiment of the present disclosure, each host material may consist of only one or more hydrocarbons. A host material consisting of at least one hydrocarbon implies that the molecule of the host material does not have an unstable bond. Such host materials or compounds are unlikely to deteriorate during the operation of the element, and the use thereof leads to a long-life organic EL element.

The unstable bond in a molecule refers to a bond having a relatively low binding energy, such as a bond to an amino group.

In the following compounds A-1, A-2, and B-1, unstable bonds are the bond linking a carbazole ring to a phenylene group and the bond linking an amino group to a phenyl group, that is, nitrogen-carbon bonds. The carbon-carbon bond as shown in compound B-1 is stable. The binding energies shown are values calculated by using b3-lyp/def2-SV(P).

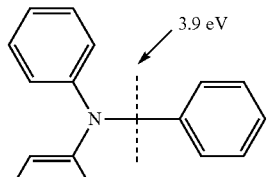
A-1

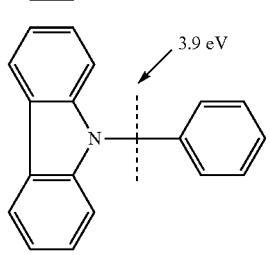
A-2

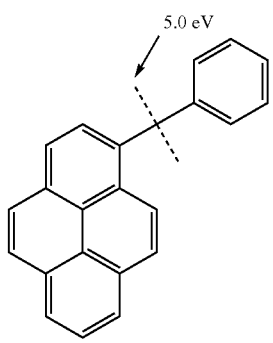
B-1

Accordingly, it is beneficial to use host materials consisting of only one or more hydrocarbons in the organic EL element.

(10) The host materials have a structure selected from the group consisting of benzene, naphthalene, fluorene, phenanthrene, chrysene, triphenylene, pyrene, fluoranthene, and benzofluoranthene.

In some embodiments, the host materials each may be an aromatic hydrocarbon that may have an alkyl group having a carbon number of 1 to 12, and the aromatic hydrocarbon may be selected from the group consisting of benzene, naphthalene, fluorene, benzofluorene, phenanthrene, chrysene, triphenylene, pyrene, fluoranthene, and benzofluoranthene.

In the organic EL element of the present disclosure, a compound having so wide a band gap as to enable the blue dopant to emit light is used as a host material. Accordingly, in some embodiments, a compound whose exciton energy when charges are recombined is high and whose molecular structure has a high binding energy may be used as the host material.

Each of the above-exemplified compounds benzene, naphthalene, fluorene, benzofluorene, phenanthrene, chrysene, triphenylene, pyrene, fluoranthene, and benzofluoranthene has a structure defined by one benzene ring or a structure having a condensed ring in which up to two benzene rings are involved in the formation of a condensed straight portion and, thus, has a high binding energy in the molecule. However, the host material may have no condensed structures like anthracene in which three or more benzene rings are condensed in a straight manner.

The structure having a condensed ring in which up to two benzene rings are involved in the formation of a condensed straight portion is resistant to bond dissociation caused by exciton energy for charge recombination compared to the structure like anthracene in which three or more benzene rings are condensed in a straight manner.

Table 1 shows the calculated bond order and dihedral angle of the bond between the phenyl group and pyrene, fluoranthene, phenanthrene, or anthracene. The structure including anthracene has a large dihedral angle and a low bond order. This means that the condensed straight structure formed by at least three benzene rings is sterically repellent and accordingly has a low bond order. As shown below, the anthracene skeleton has a repulsion between the 1-position and 8-position hydrogens thereof and the 11-position and 12-position hydrogens of the phenyl group. In the pyrene structure, while a similar repulsion occurs between the 10-position hydrogen thereof and the 11-position hydrogen of the phenyl group, the repulsion between the 2-position hydrogen and the 12-position hydrogen is small. In addition, an anthracene substituted at the 2-position but not at the 9- or 10-position, as shown below, has substitution positions with a high electron density in the central benzene ring, accordingly easy to oxidize. Such anthracene compounds are chemically unstable aromatic hydrocarbons.

Thus, the structure having a condensed ring in which up to two benzene rings are involved in the formation of a condensed straight portion has a higher bond order and has a higher binding energy resistant to bond dissociation caused by exciton energy when charges are recombined, compared to the structure like anthracene in which three or more benzene rings are condensed in a straight manner.

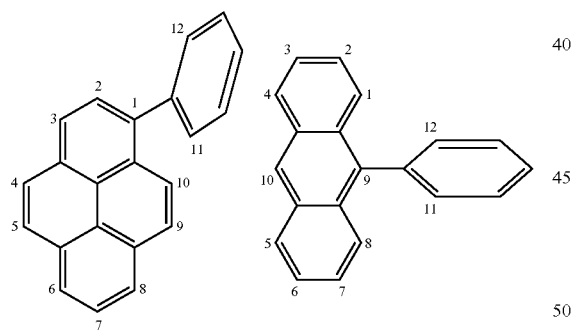

TABLE 1

| Structure | Bond order | Dihedral angle [°] |
|---|---|---|
| | 0.995 | 90.0 |
| | 1.029 | 56.0 |
| | 1.023 | 58.6 |
| | 1.014 | 62.8 |
| | 1.037 | 51.2 |
| | 1.019 | 59.1 |

The molecular structures were analyzed in accordance with density functional theory (DFT). The functional and basis function used for calculation for dihedral angle, B3LYP and 6-31G* are used, respectively, and Natural Bonding Orbital (NBO) analysis was applied for binding order, using Wiberg bond index.

Thus, in some embodiments, the host materials each may be a compound having a structure defined by one benzene ring or a structure having a condensed ring in which up to two benzene rings are involved in the formation of a condensed straight portion, such as benzene, naphthalene, fluorene, benzofluorene, phenanthrene, chrysene, triphenylene, pyrene, fluoranthene, or benzofluoranthene. Such host materials are resistant to bond dissociation caused by exciton energy when charges are recombined, and use thereof leads to a highly durable organic EL element. In addition, the second and the third luminescent layer, or the blue and the green luminescent layer, containing such a host material have large excitation energy, accordingly producing a more satisfactory effect. Stable host materials can produce more favorable effect when the same host material is used in the first to the third luminescent layer.

The above-mentioned compounds that may be used as the host material may be substituted by an alkyl group having a carbon number of 1 to 12. Examples of such a substituent include methyl, ethyl, n-propyl, isopropyl, n-butyl, isobutyl, sec-butyl, tert-butyl, n-pentyl, isopentyl, neopentyl, tert-pentyl, hexyl, heptyl, and octyl.

Examples of the host materials are as follows, but the host materials are not limited to the following:

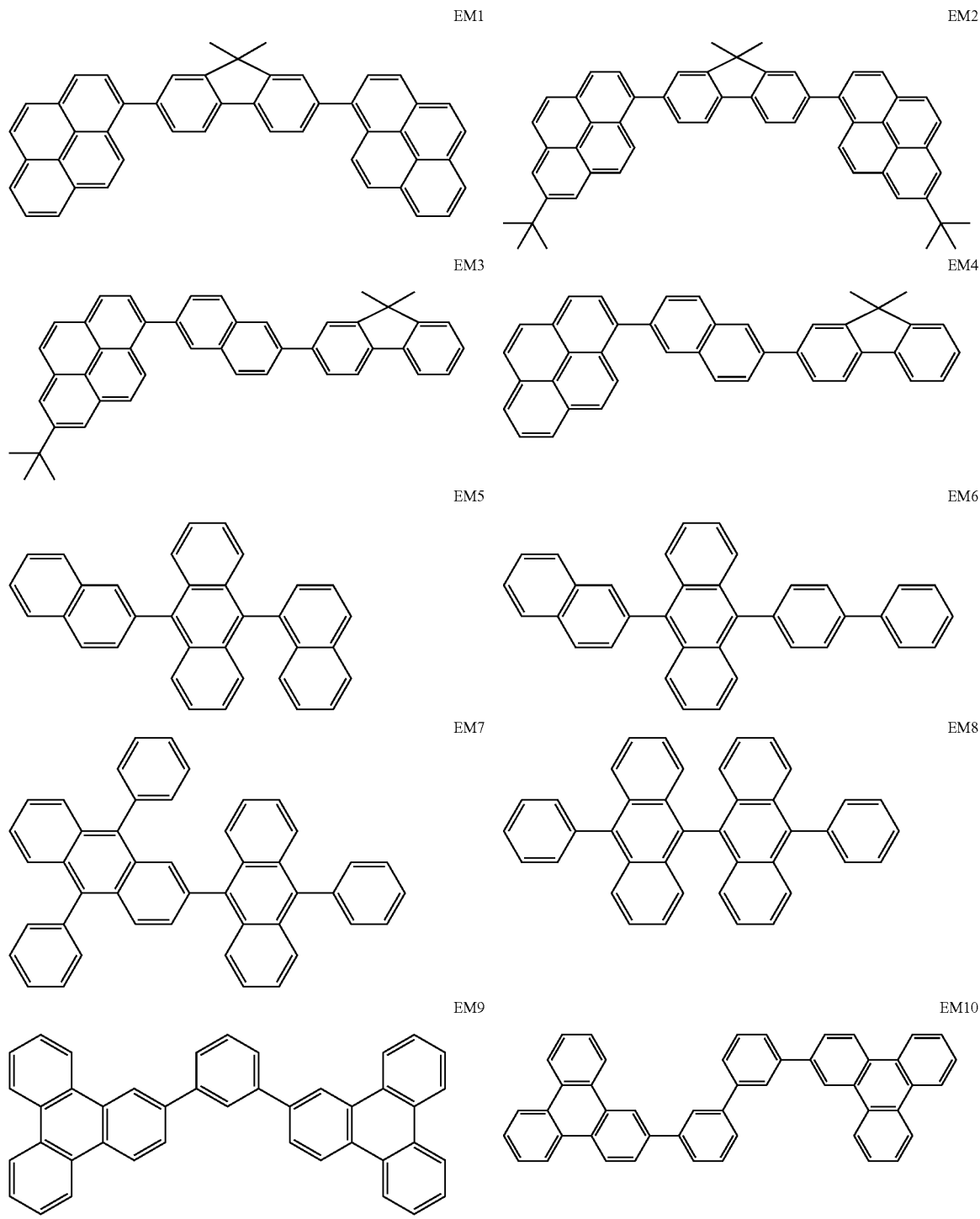

-continued
EM11
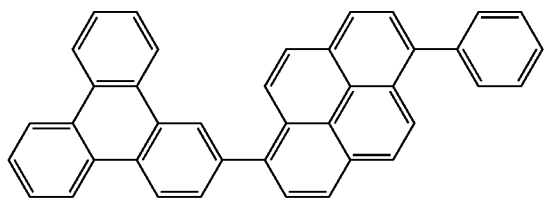
EM12
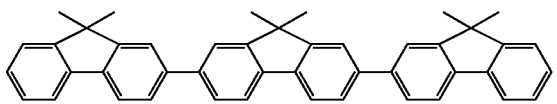
EM13
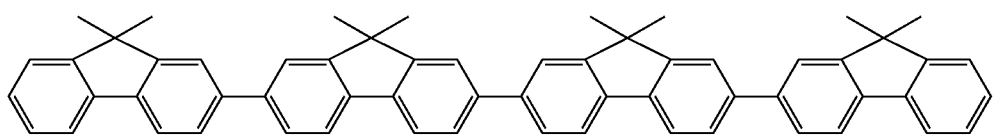
EM14
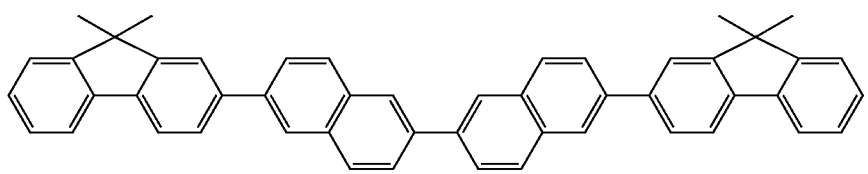
EM15
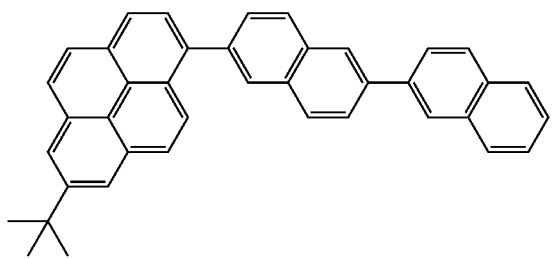
EM16
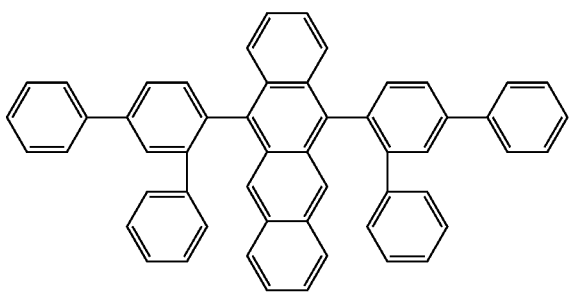
EM17
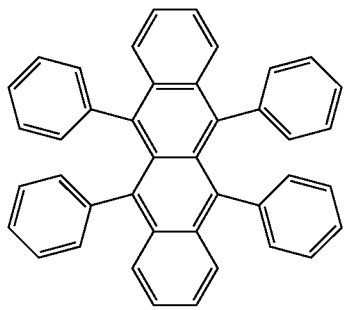
EM18
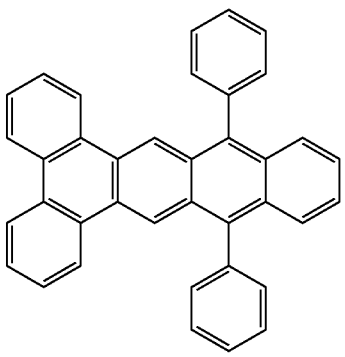
EM19
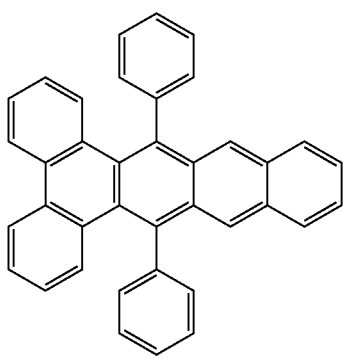
EM20
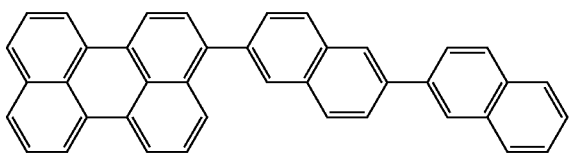

-continued
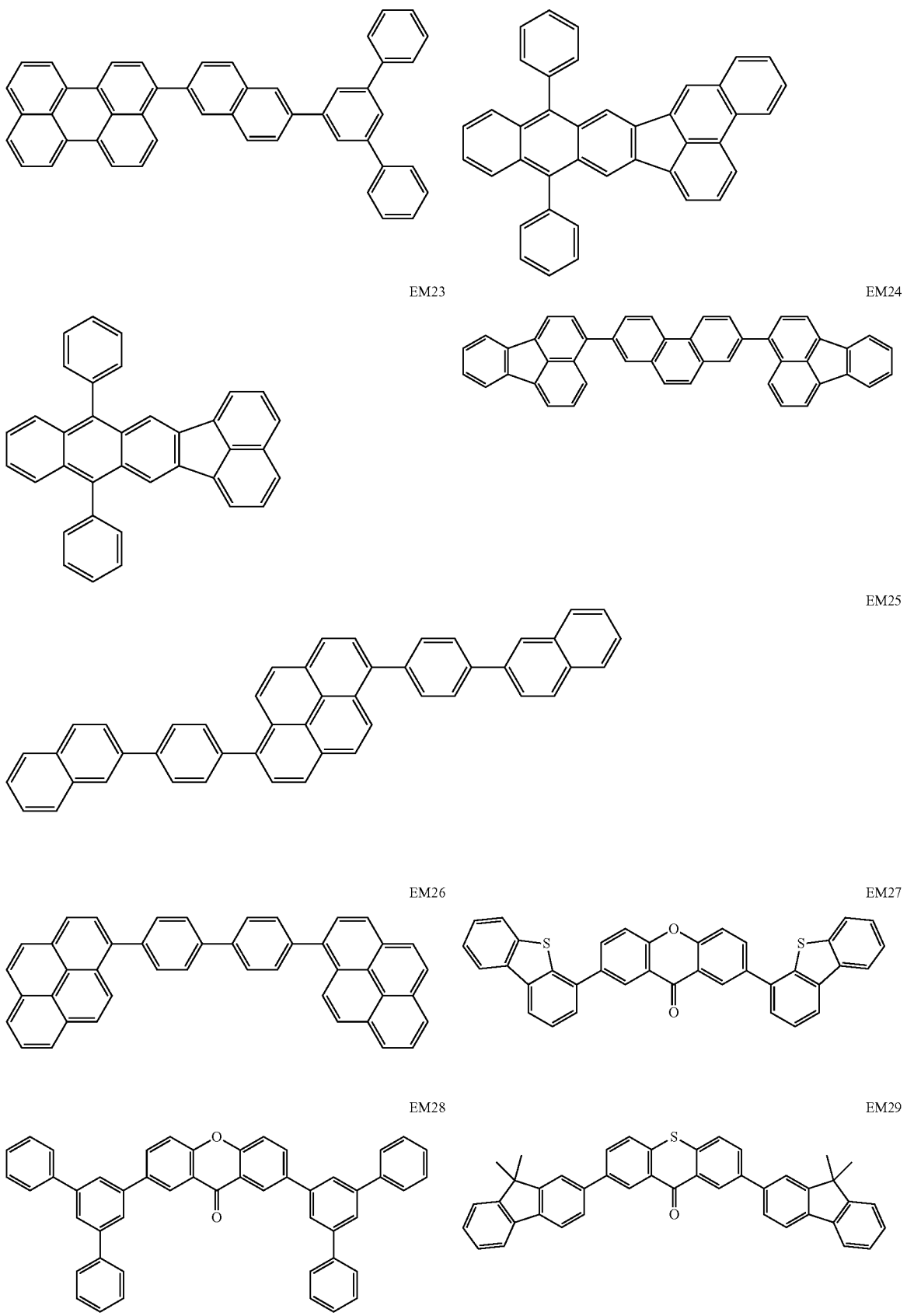

EM30

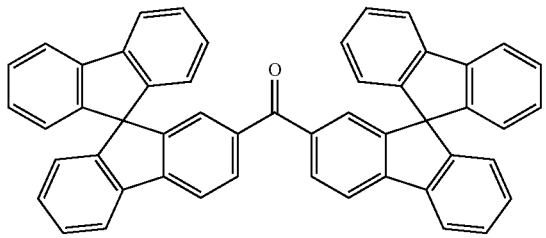

EM31

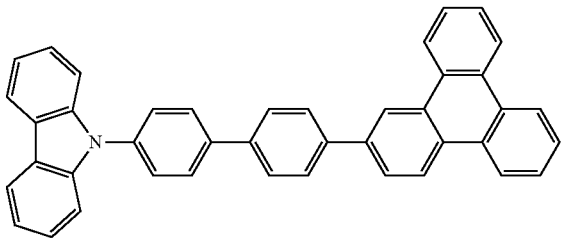

In some embodiments, EM1 to EM26, which consist of only a hydrocarbon, may be selected from among those host materials in view of the above-described binding stability, and the second host material may be selected from among EM1, EM2, EM3, EM4, EM9, EM10, EM11, EM12, EM13, EM14, EM15, EM24, EM25, and EM26 that include benzene, naphthalene, fluorene, benzofluorene, phenanthrene, chrysene, triphenylene, pyrene, fluoranthene, or benzofluoranthene. Use of such host materials leads to a durable organic EL element.

(11) The organic EL element includes a layer in contact with the third luminescent layer between the third luminescent layer and the cathode, the layer containing an organic compound consisting of a hydrocarbon.

In an embodiment, the organic EL element may further include an organic compound layer, such as a hole blocking layer, between the luminescent layers and the cathode. To block holes about to pass through the luminescent layer, the hole blocking layer accumulates holes at the interface with the luminescent layers. It is therefore beneficial that the material of the hole blocking layer has a molecular structure resistant to excessively generated radical cations and that the hole blocking layer contains an organic compound consisting of a hydrocarbon.

In general, compounds containing a heteroatom, such as nitrogen, oxygen, or sulfur, have an unshared electron pair and are, accordingly, active for electron donation and acceptance, that is, for redox. Accordingly, interaction such as disproportionation caused by unpaired electrons generated by electron donation and acceptance may cause the material to deteriorate. Thus, such compounds are chemically unstable. In contrast, hydrocarbons do not have an unshared electron pair and are therefore chemically stable.

Examples of the blue dopant used in the organic EL element of the present disclosure include, but are not limited to:

BD1

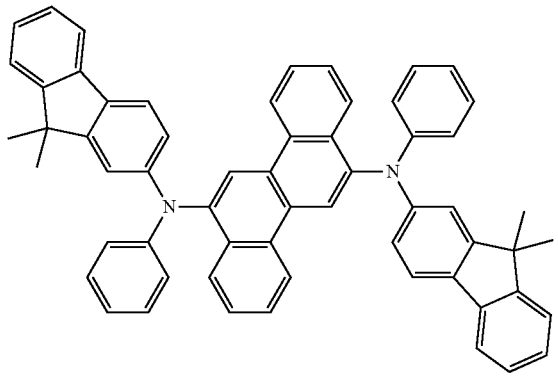

BD2

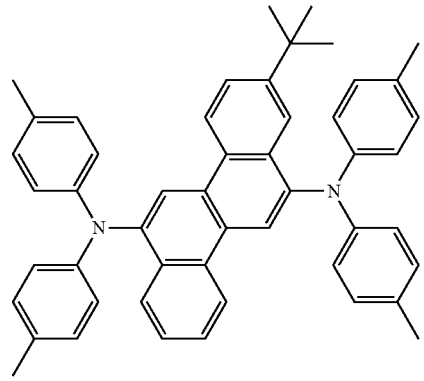

BD3

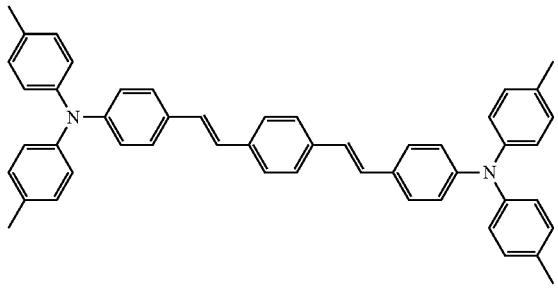

BD4

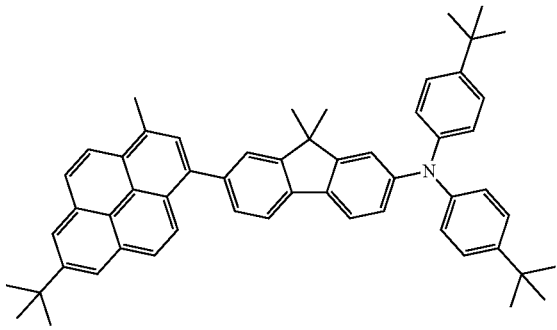

-continued
BD5
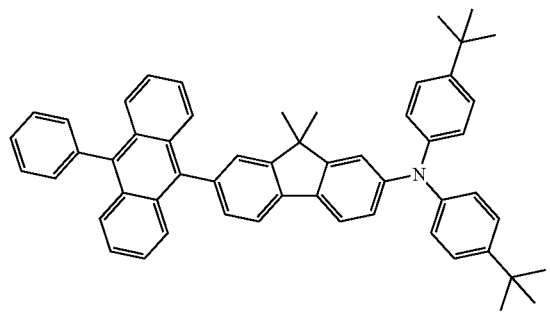
BD6
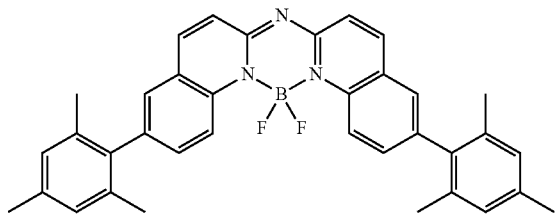
BD7
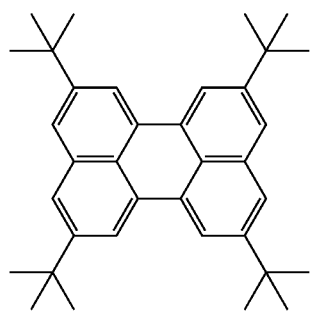
BD8
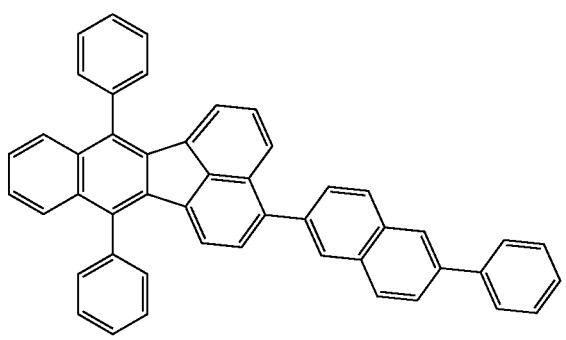
BD9
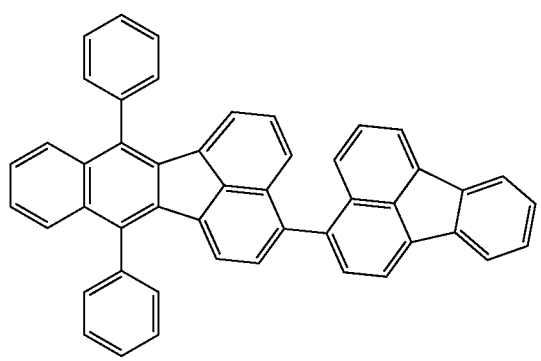
BD10
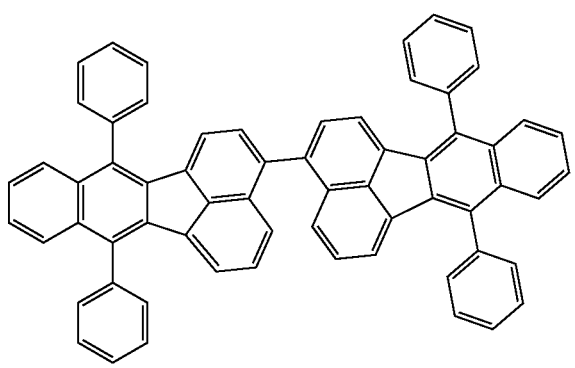
BD11
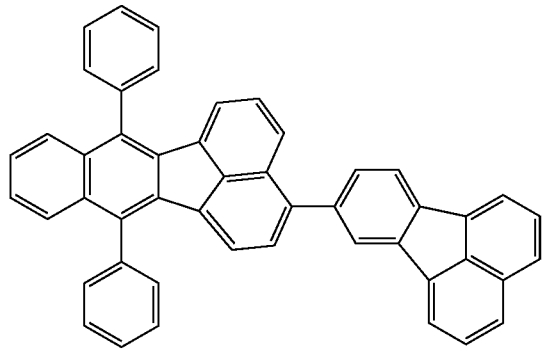
BD12
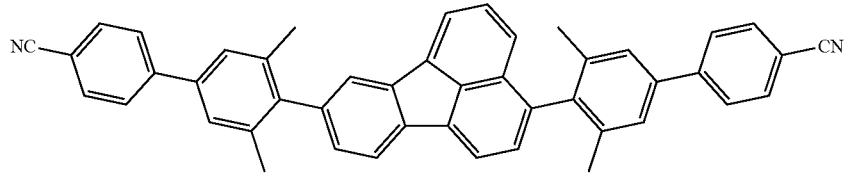

-continued
BD13
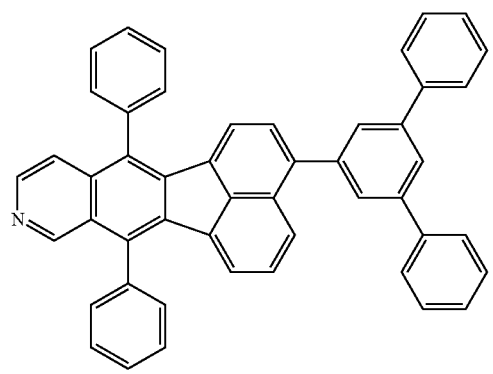
BD14
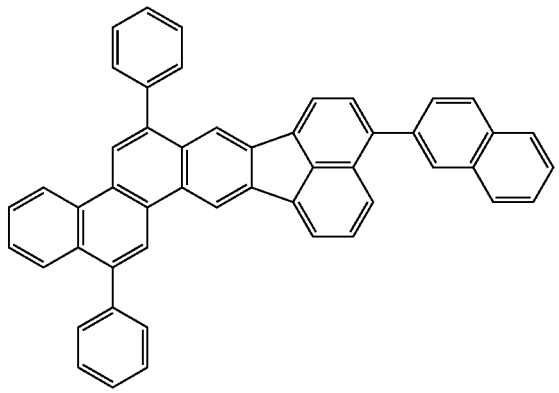
BD16
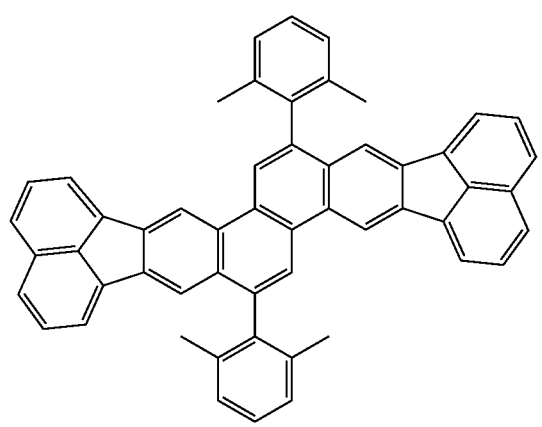
BD15
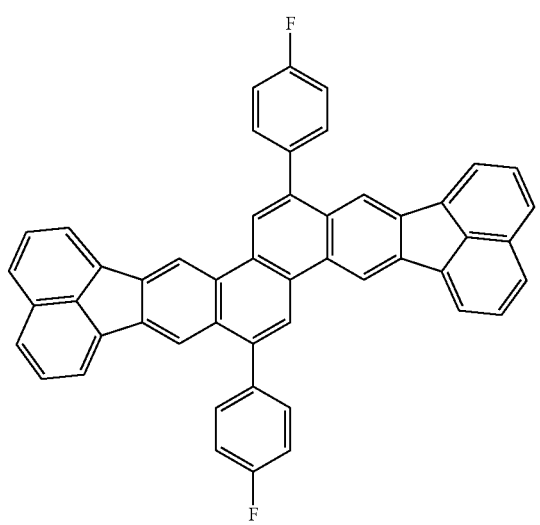
BD17
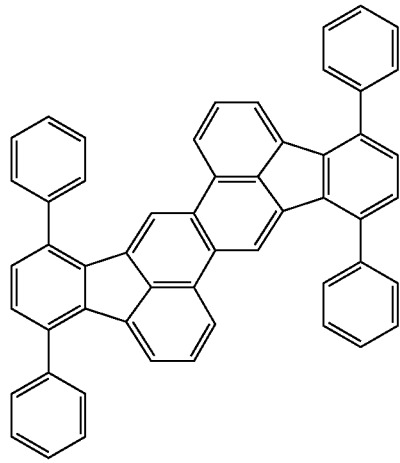
BD18
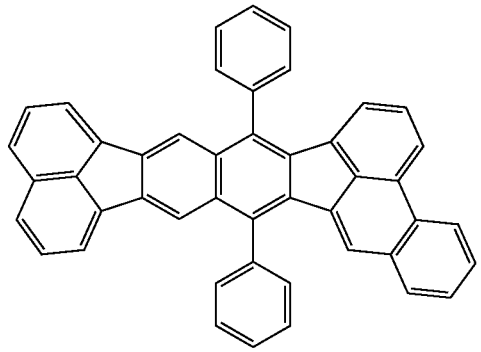

-continued
BD19
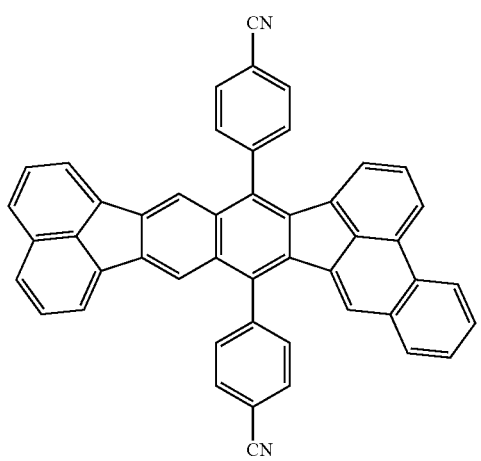
BD20
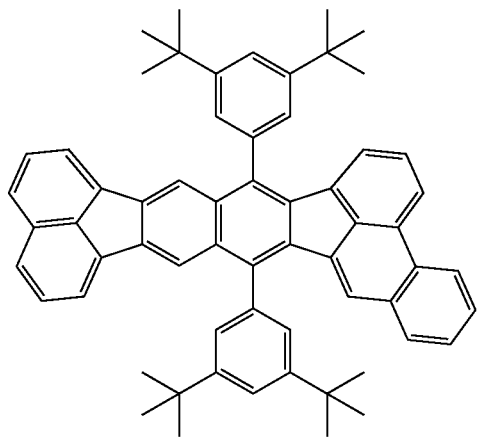
BD21
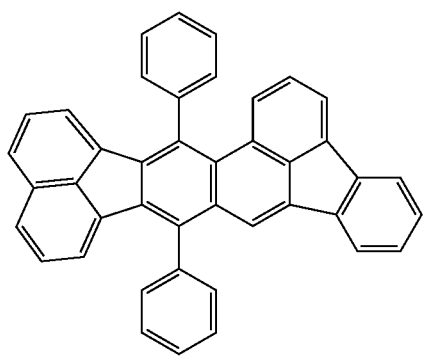
BD22
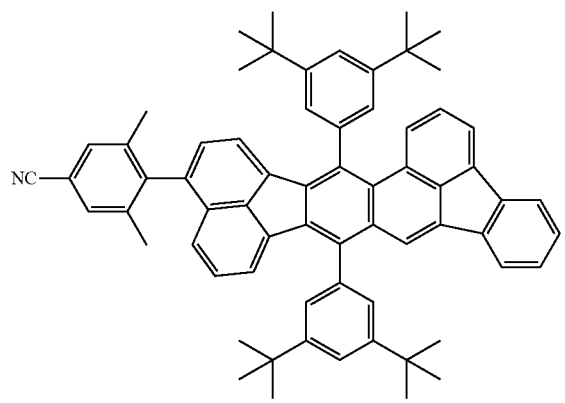
BD23
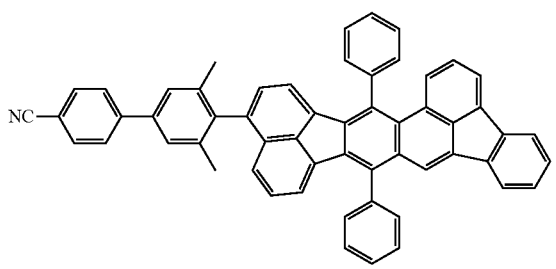
BD24
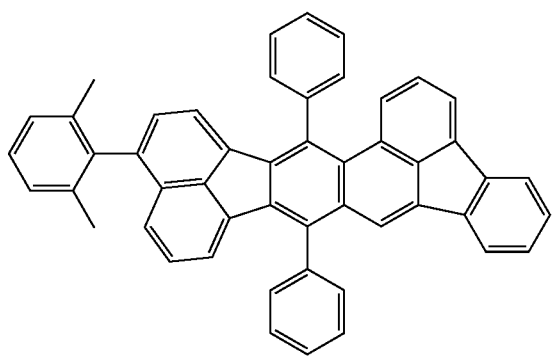

-continued
BD25
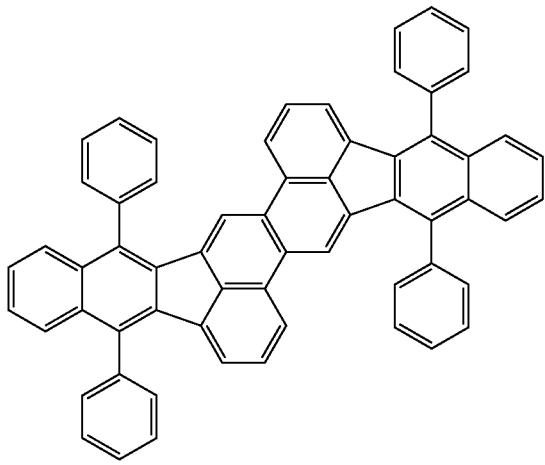
BD26
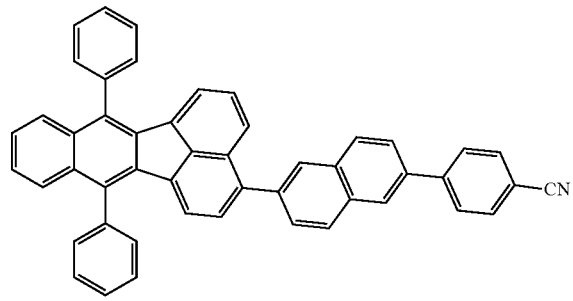
BD27
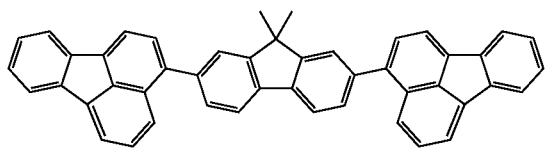
BD28
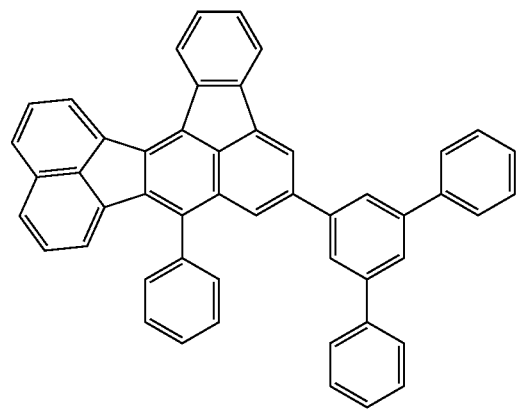
BD29
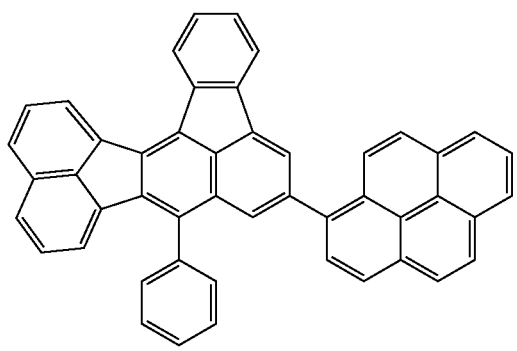
BD30
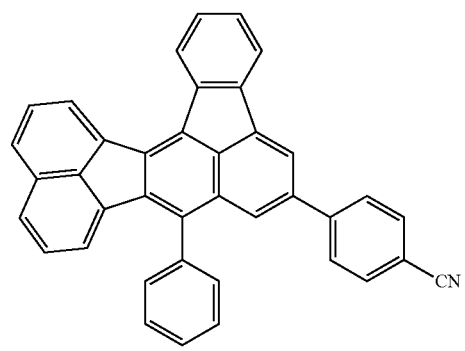
BD31
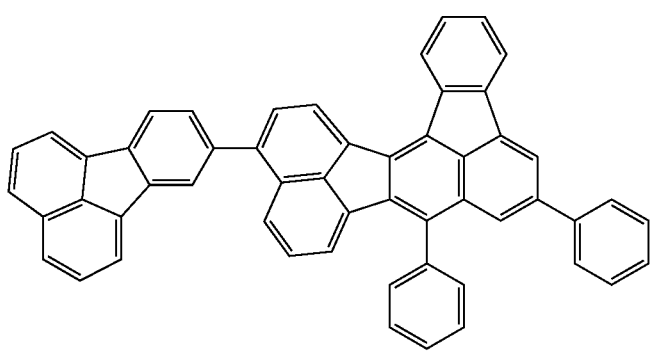

In some embodiments, the blue dopant does not have an electron-donating substituted amino group but has an electron-withdrawing cyano group. The LUMO energy level of such a dopant can be deep.

The blue dopant content may be 0.1% by weight to 5% by weight and, in some embodiments, may be 0.1% by weight to 1% by weight. By controlling the blue dopant content in such a range, blue emission is likely to contribute to balanced emission from the organic EL element.

Examples of the green dopant used in the organic EL element of the present disclosure include, but are not limited to:

GD1

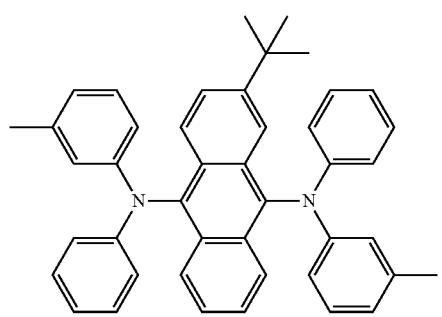

GD2

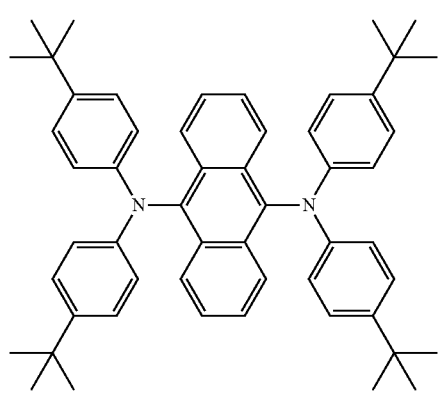

GD3

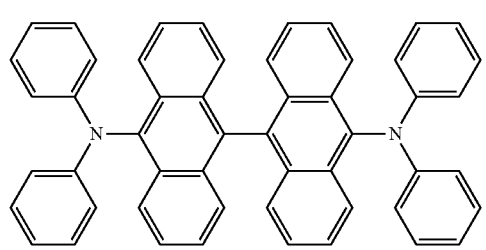

GD4

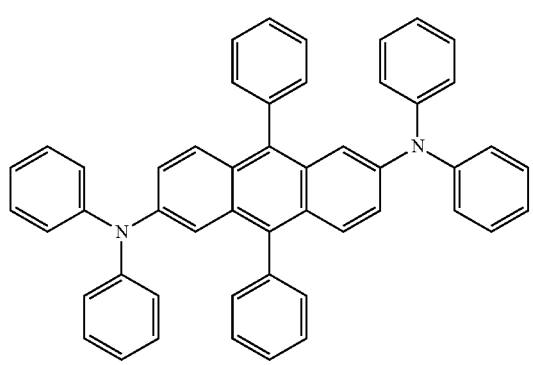

-continued

GD5

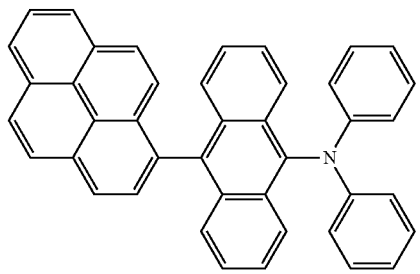

GD6

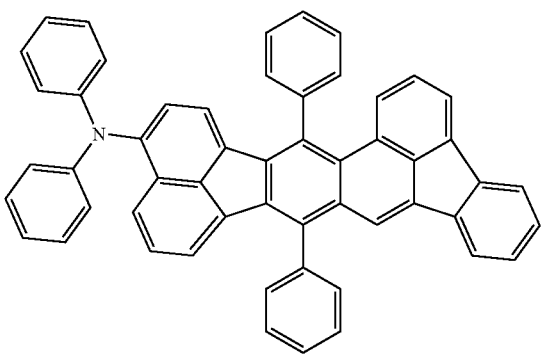

GD7

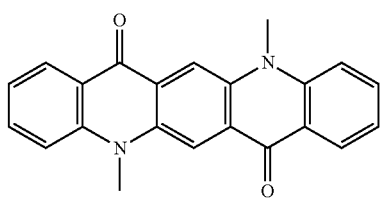

GD8

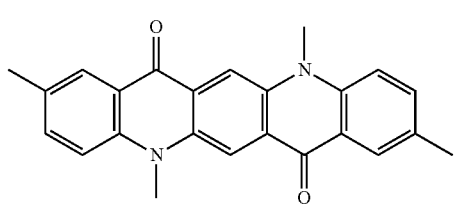

GD9

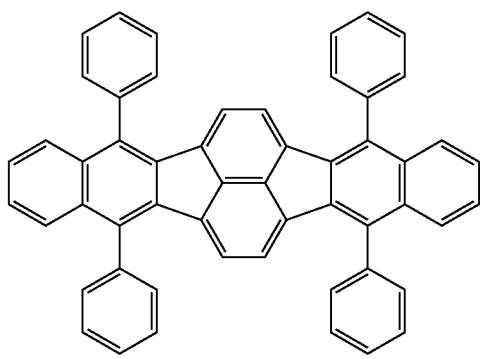

-continued
GD10
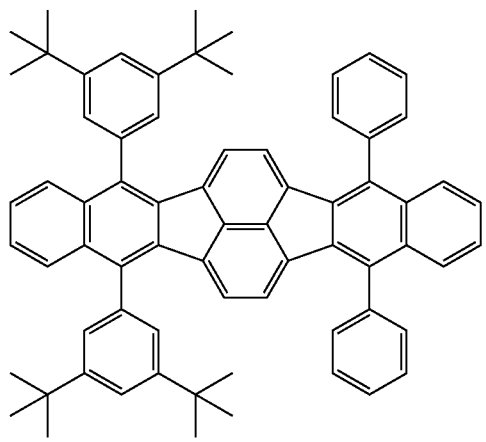
GD13
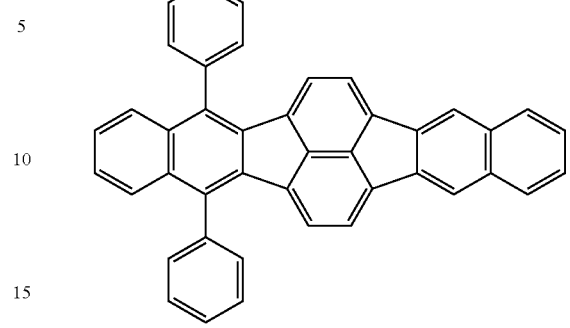
GD11
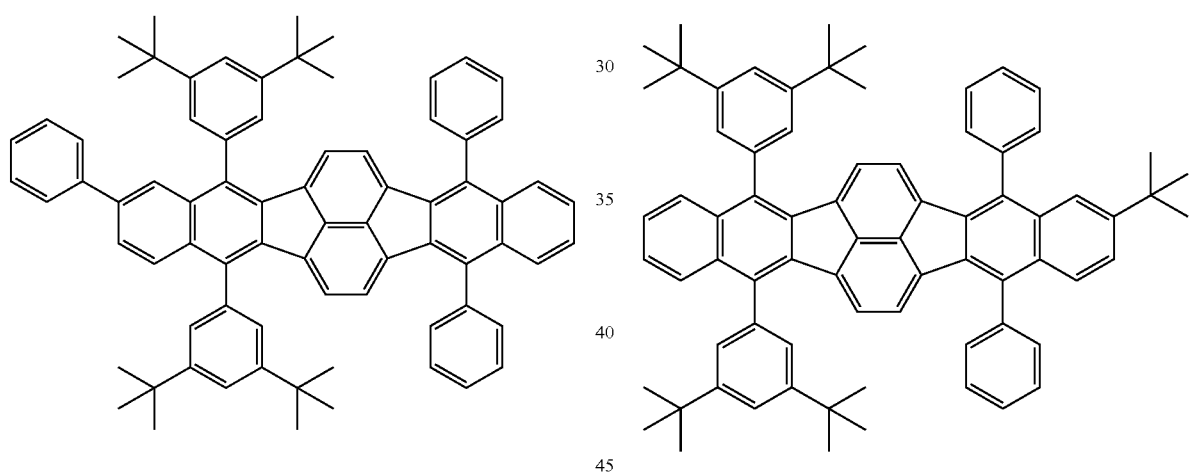
GD14
GD12
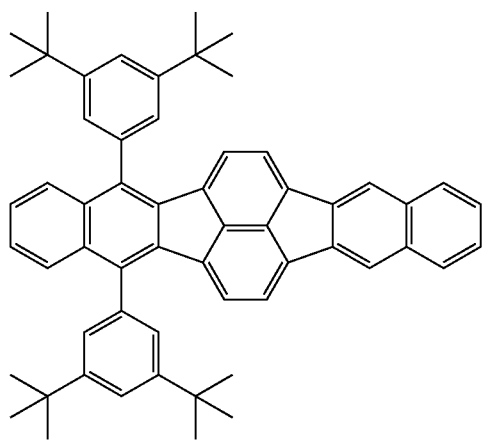
GD15
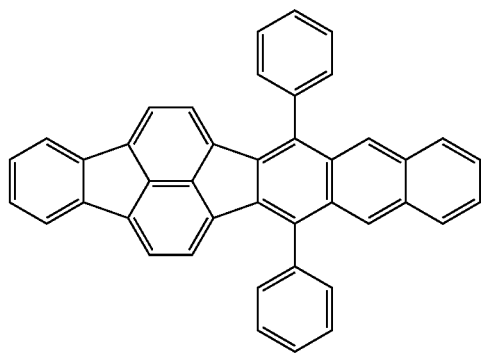

GD16
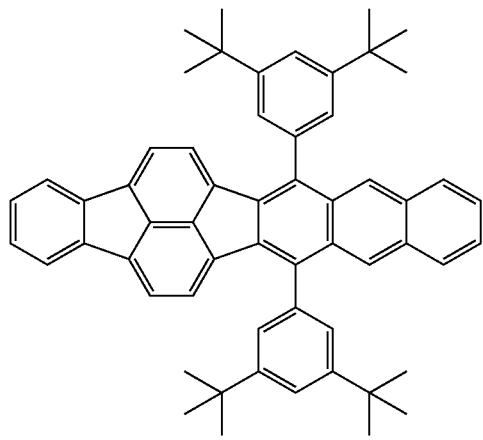
GD20
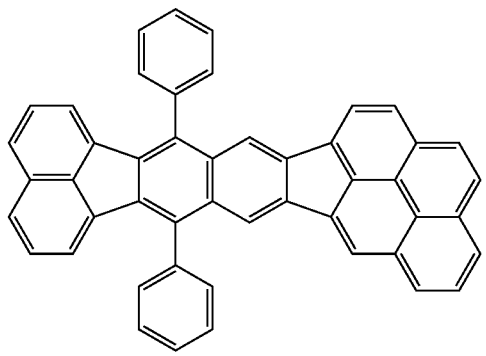
GD17
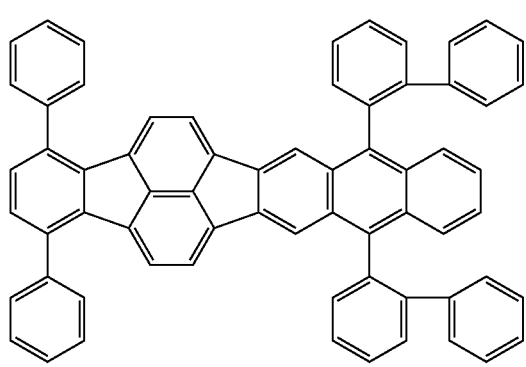
GD21
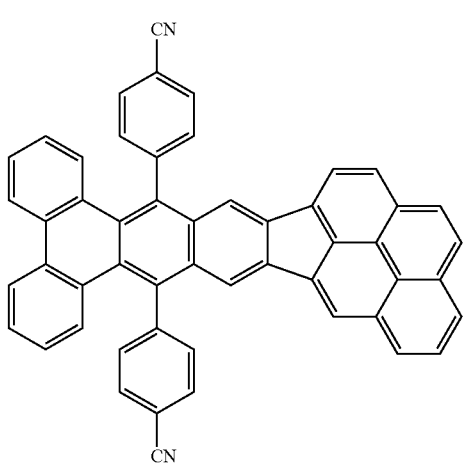
GD18
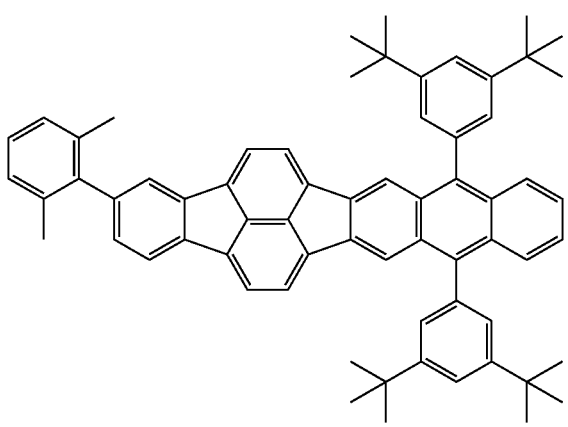
GD22
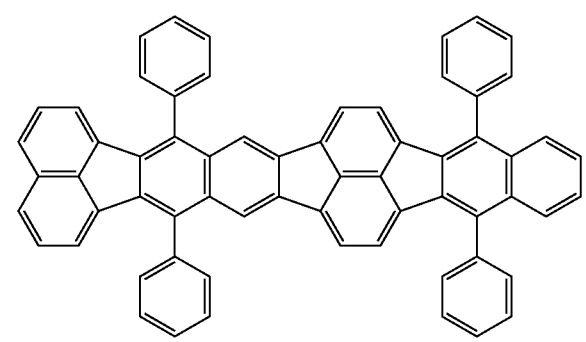
GD19
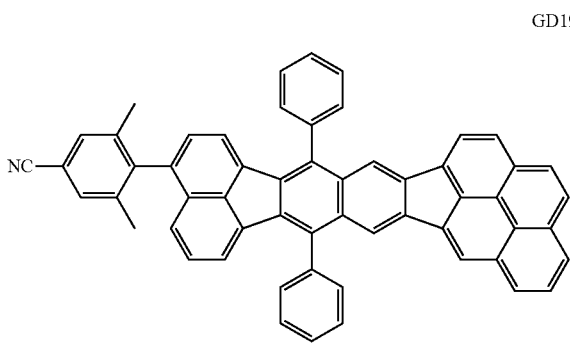
GD23
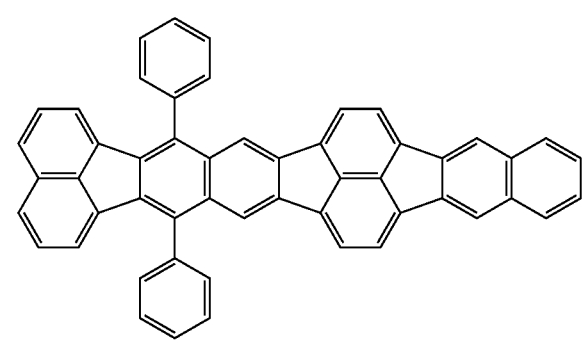

GD24
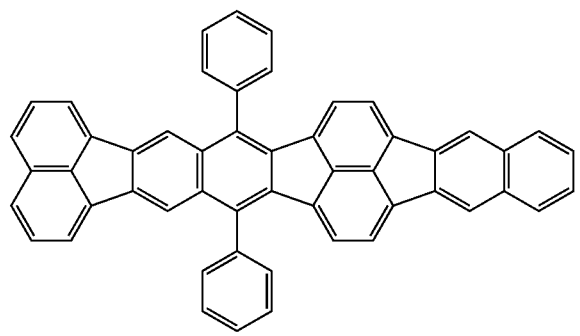
GD25
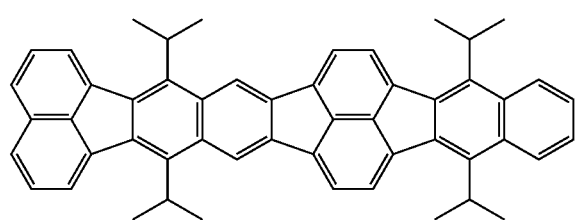
GD26
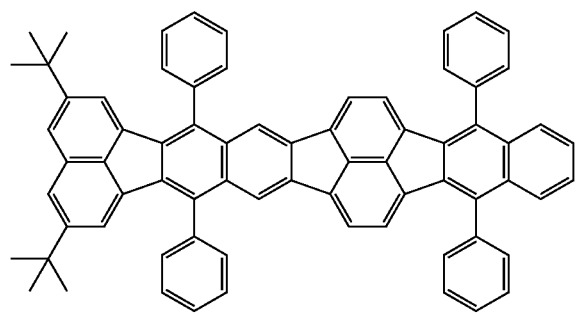
GD27
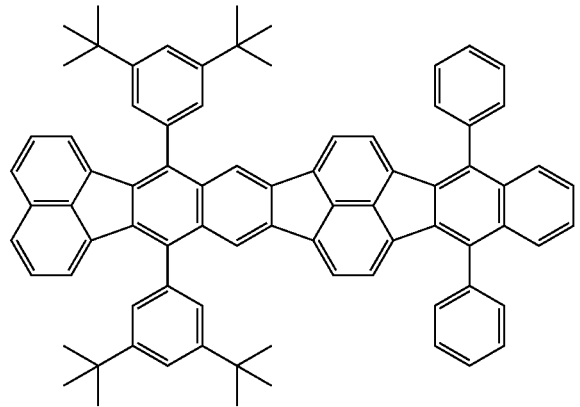
GD28
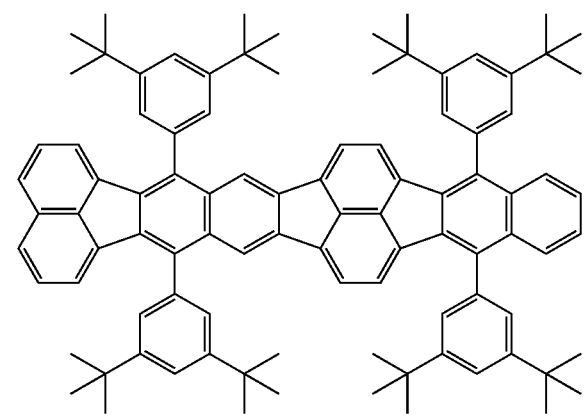
GD29
GD30
GD31
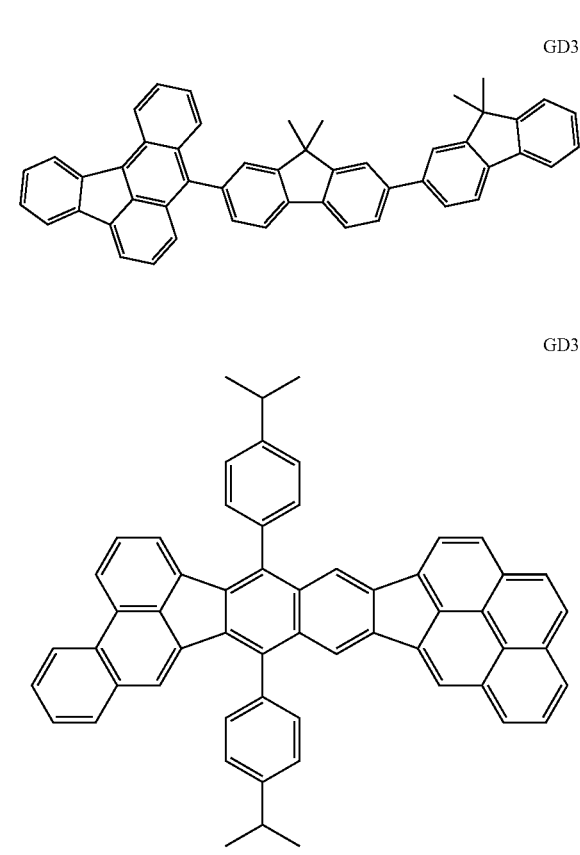

-continued

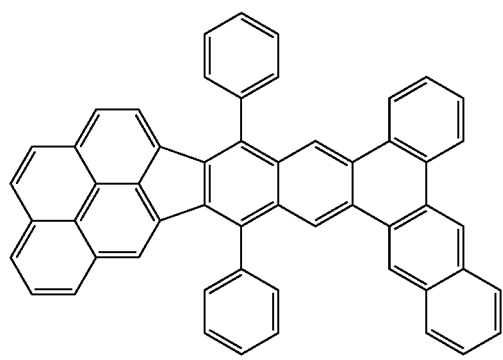
GD32

In some embodiments, the green dopant may be an organic compound whose chemical bonds are all stable. The green dopant content may be 0.1% by weight to 10% by weight or 1% by weight to 5% by weight. The green dopant content in the third luminescent layer may be 0.1% by weight to 5% by weight and, in some embodiments, may be 0.1% by weight to 1% by weight. By controlling the green dopant content in such a range, green emission is likely to contribute to balanced emission from the organic EL element.

Examples of the red dopant used in the organic EL element of the present disclosure include, but are not limited to:

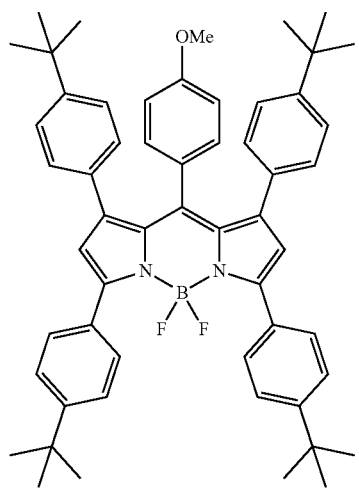
RD1

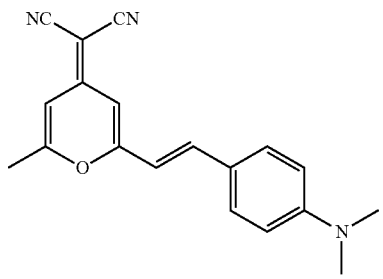
RD2

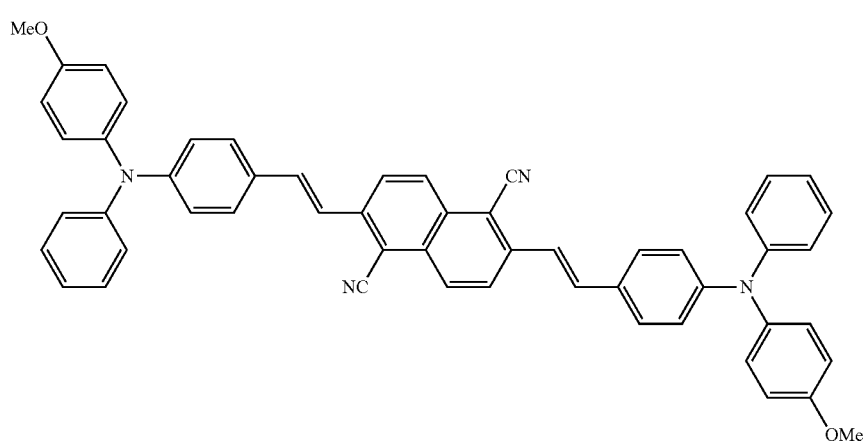
RD3

-continued
RD4
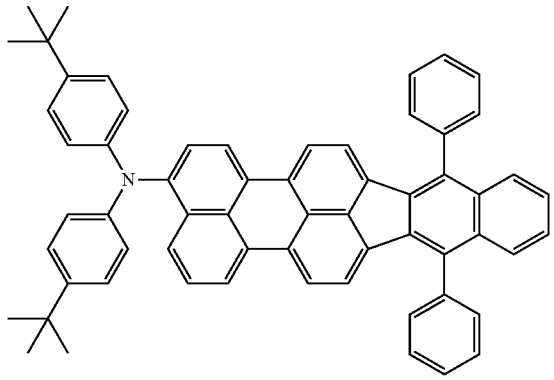
RD5
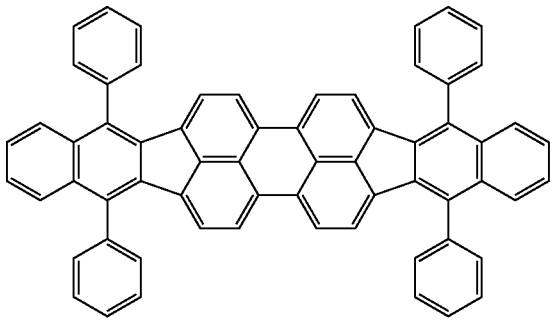
RD6
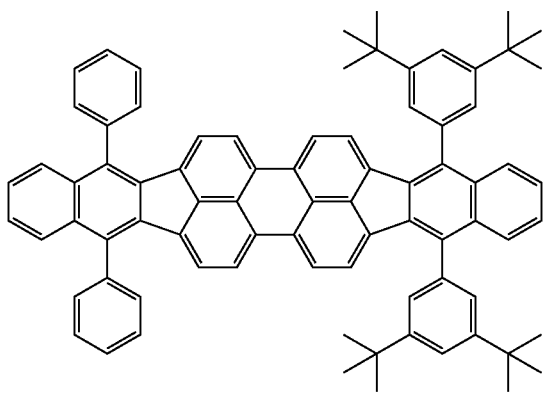
RD7
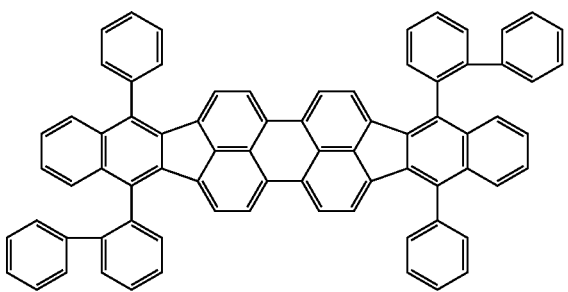
RD8
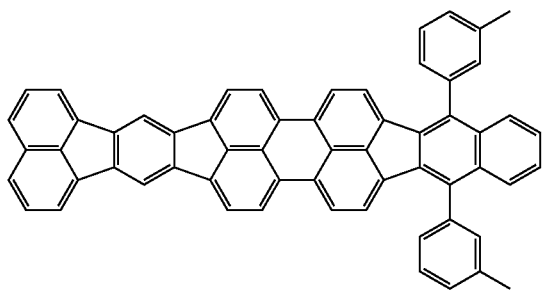
RD9
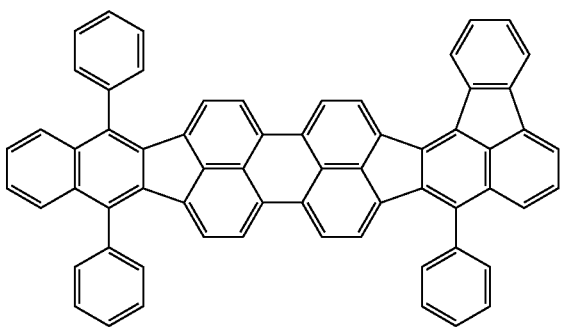
RD10
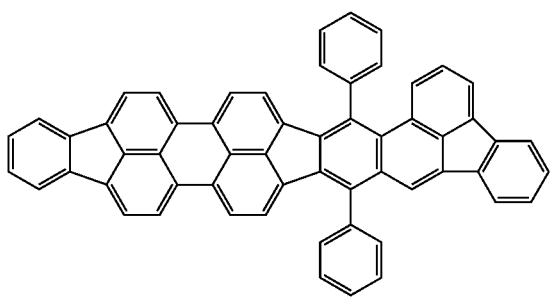
RD11
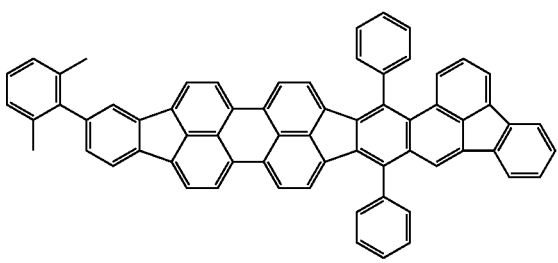

-continued
RD12
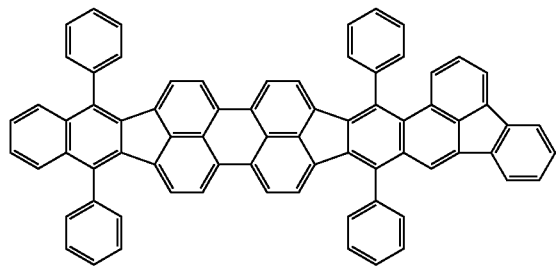
RD13
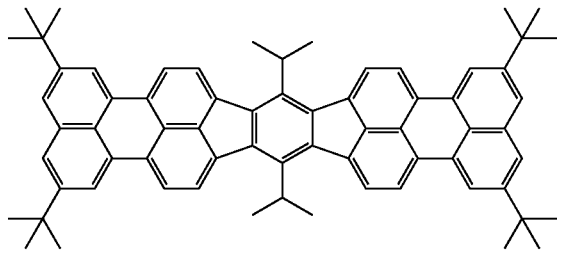
RD14
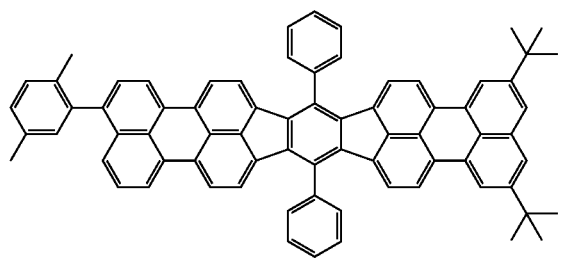
RD15
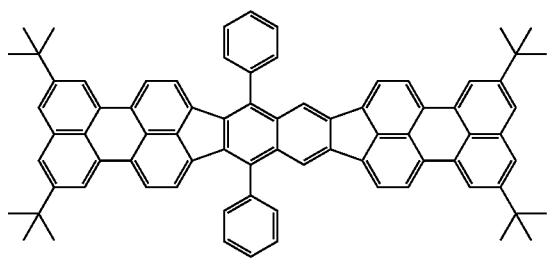
RD16
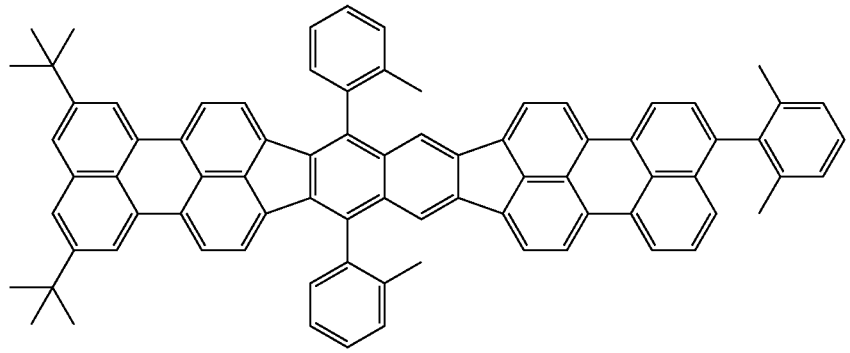
RD17
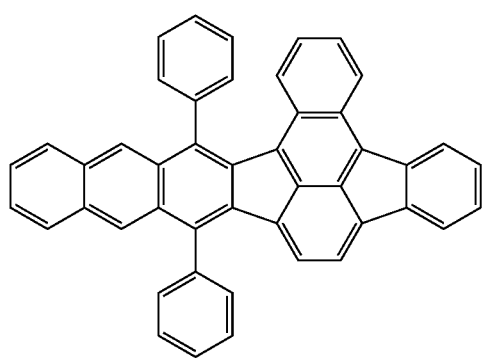
RD18
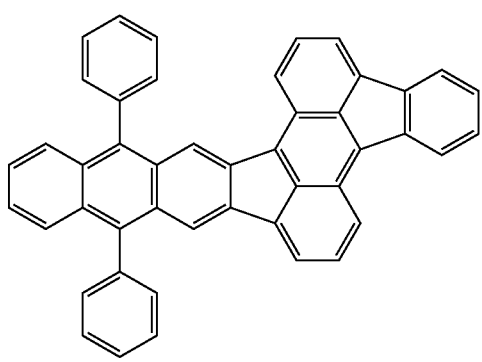
RD19
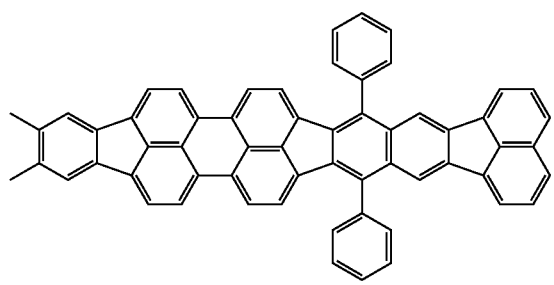
RD20
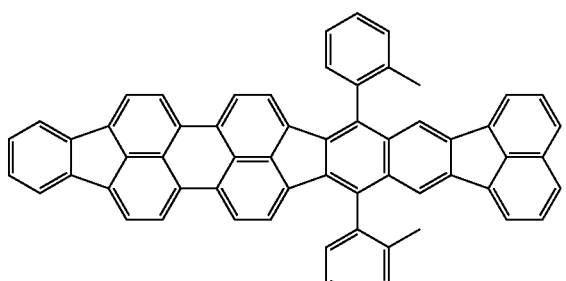

-continued

RD21
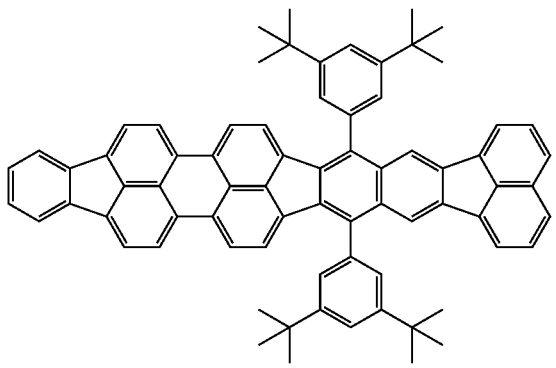

RD22
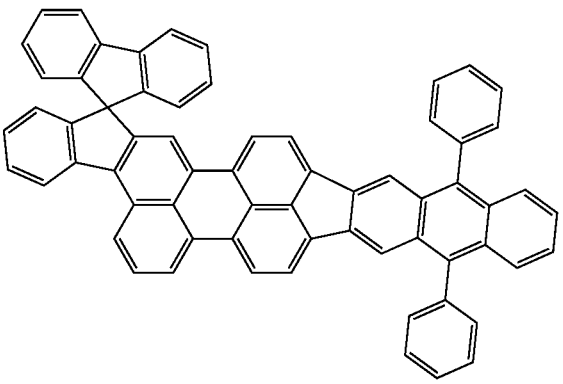

RD23
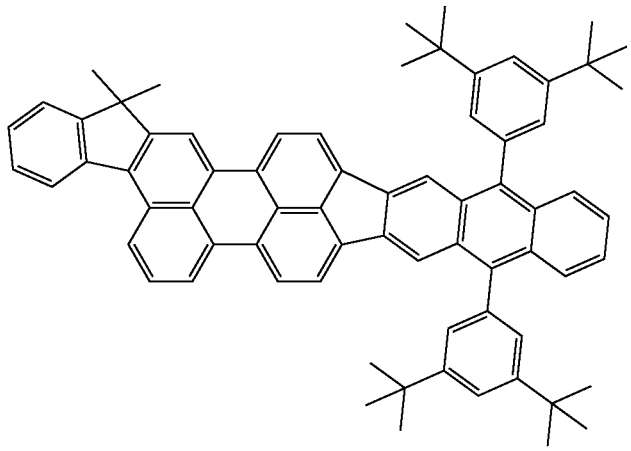

In some embodiments, a hydrocarbon may be selected from the above-exemplified red dopants in view of binding stability.

The red dopant content may be 0.1% by weight to 5% by weight and, in some embodiments, may be 0.1% by weight to 0.5% by weight. By controlling the red dopant content in such a range, red emission is likely to contribute to balanced emission from the organic EL element.

Other Members of the Organic EL Element

Substrate

The substrate of the organic EL element of the present disclosure may be made of Si, glass, or a resin. Si substrates allow transistors to be formed therein to provide a microdisplay device. Glass substrates allow TFTs to be formed to provide a TFT display device. Resin substrates may be called flexible substrates. Use of a flexible substrate leads to a foldable or rollable display device. The substrate may be optically transparent or opaque provided that the substrate does not interfere with emission direction.

Electrodes

In an embodiment of the organic EL element of the present disclosure, the anode may be a reflective electrode, and the cathode may be a transmissive electrode. In another embodiment, both the anode and the cathode are transmissive, or the anode may be transmissive, while the cathode is reflective.

In an embodiment, the anode is optically reflective, the cathode is optically transmissive, and the distance between the anode and the cathode is such that the emission from at least one of the first, the second, and the third luminescent layer is enhanced with the distance. Such a structure helps optical interference, increasing light extraction efficiency.

In some embodiments, the reflective electrode of the organic EL element may be made of a metal material having a reflectance of 80% or more. More specifically, the material of the reflective electrode may be a metal, such as Al or Ag, or an alloy thereof with Si, Cu, Ni, Nd, Ti, or the like. The alloy may be AgMg, AlCu, TiN, or the like. The term reflectance mentioned here refers to the reflectance at the emission wavelength of the luminescent layer. The reflective electrode may be provided with a barrier layer on the surface on the light extraction side thereof. The barrier layer may be made of a metal, such as Ti, W, Mo, or Au, or an alloy thereof. The alloy may be any one of the above-mentioned alloys.

In an embodiment, the transmissive electrode of the organic EL element may be a semi-transmissive reflection layer (that is, a transflective layer) that transmits a portion of the light incident on the surface thereof and reflects the other portion. The transflective electrode is made of, for example, an elemental metal, such as magnesium or silver, or an alloy containing mainly magnesium or silver or containing an alkali metal or an alkaline-earth metal.

If the second electrode is made of an alloy, the alloy may be a magnesium-silver alloy. The ratio of magnesium to silver may be 1:1, or either atomic percent may be higher than the other. If either atomic percent is higher than the other, the atomic percent of silver may be higher. Magnesium-silver alloys with a higher silver atomic percent than the magnesium atomic percent have a high transmittance.

Alternatively, the magnesium atomic percent may be higher than the silver atomic percent. Magnesium-silver alloy with a higher magnesium atomic percent than the silver atomic percent can form a film not easy to break.

The transmissive electrode may have a multilayer structure provided that it has a favorable transmittance.

The electrodes of the organic EL element may be formed by sputtering or vapor deposition.

Organic Compound Layers

The organic EL element of the present disclosure may further include a hole injection layer, a hole transport layer, an electron blocking layer, a hole blocking layer, an electron transport layer, an electron injection layer, and the like in addition to the luminescent layers. Any of such organic compound layers may be provided, or none of them may be provided. As an alternative to an organic compound layer, an inorganic compound layer may be provided.

The organic EL element may take various structures. For example, the organic EL element of an embodiment may further include an insulating layer between an electrode and an organic compound layer, or may have an adhesion layer or an interference layer. The electron transport layer or the hole transport layer may be composed of two layers having different ionization potentials.

The organic compound layer(s) may be a common layer shared by a plurality of organic EL elements. The term "common layer" implies that the layer is disposed across the plurality of organic EL elements and may be formed by a coating process, such as spin coating, or vapor deposition for the entire surface of the substrate.

Materials of the organic compound layers will now be described below. In some embodiments, the hole transport layer may contain a material having so high a hole mobility as facilitates hole injection from the anode or allows injected holes to be transported to the luminescent layer. Such a material may also be used in the hole injection layer and the electron blocking layer.

Also, from the viewpoint of reducing the crystallization or any other deterioration of the material in the organic EL element, the material may have a high glass transition temperature. Low-molecular-weight or polymeric materials having a high hole mobility include triarylamine derivatives, arylcarbazole derivatives, phenylenediamine derivatives, stilbene derivatives, phthalocyanine derivatives, porphyrin derivatives, poly(vinyl carbazole), polythiophene, and other conductive polymers.

HT1 to HT19 are materials that can be used in the hole transport layer 3, but the material of the hole transport layer is not limited to these.

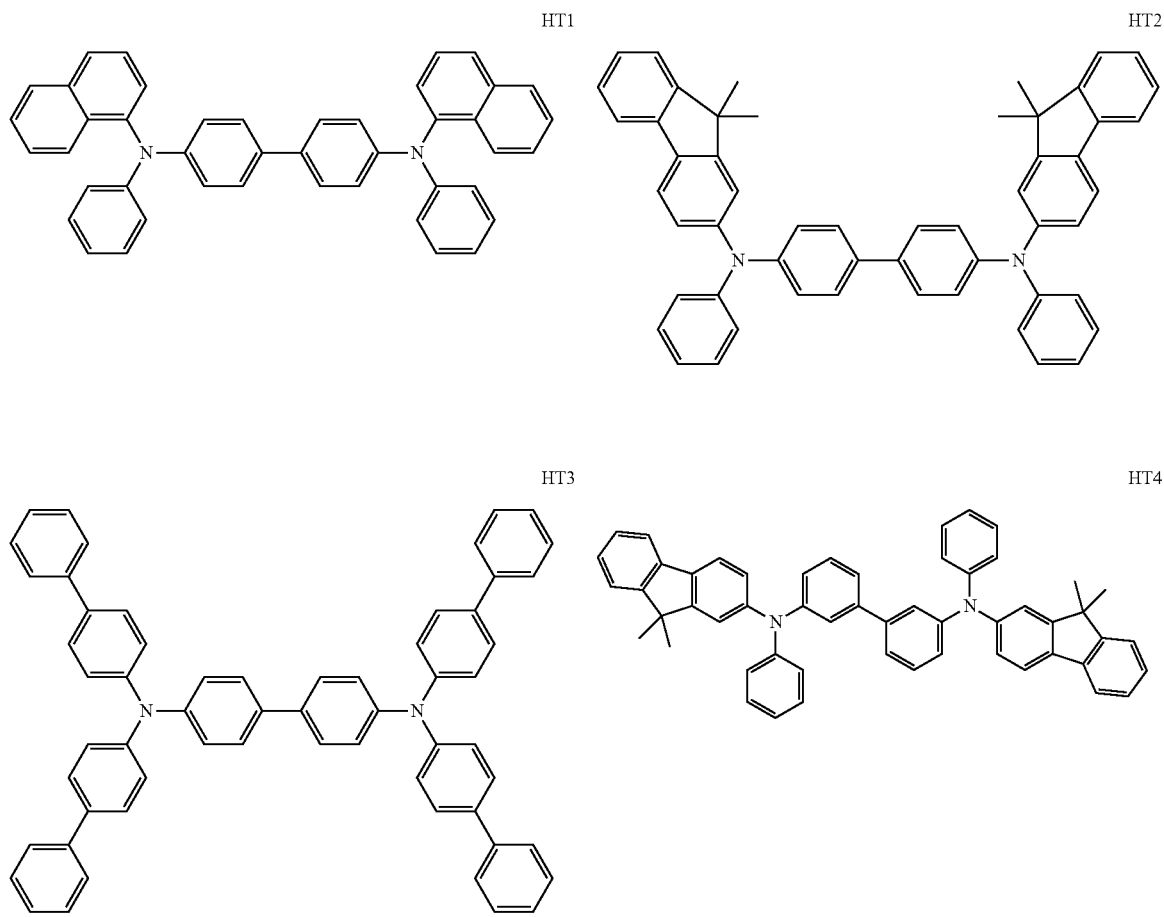

-continued
HT5
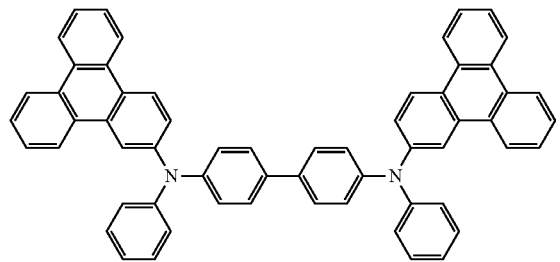
HT6
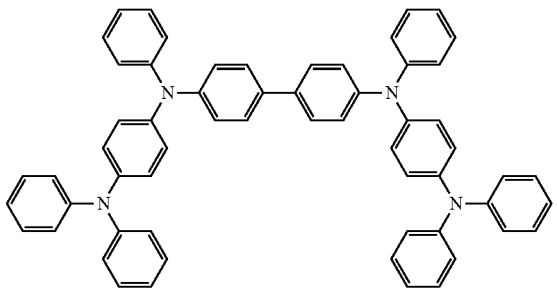
HT7
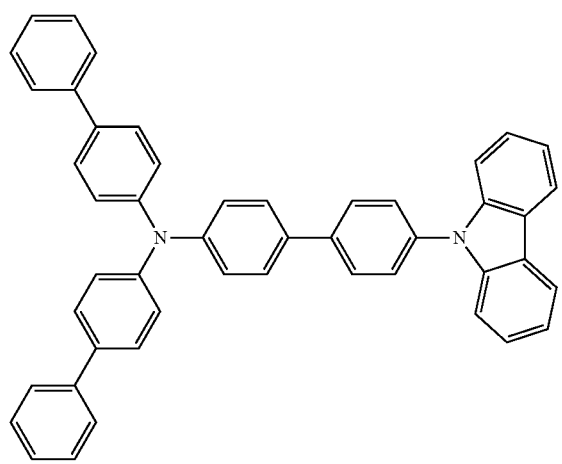
HT8
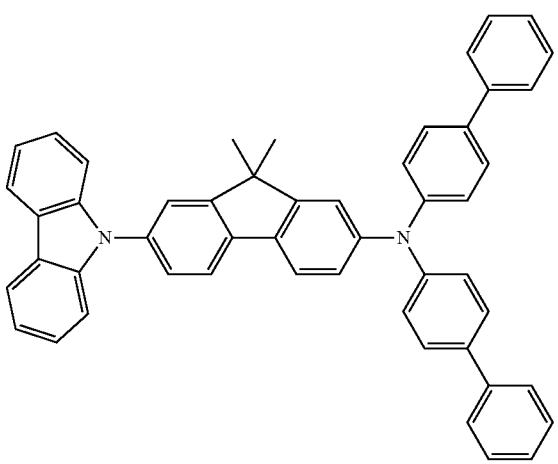
HT9
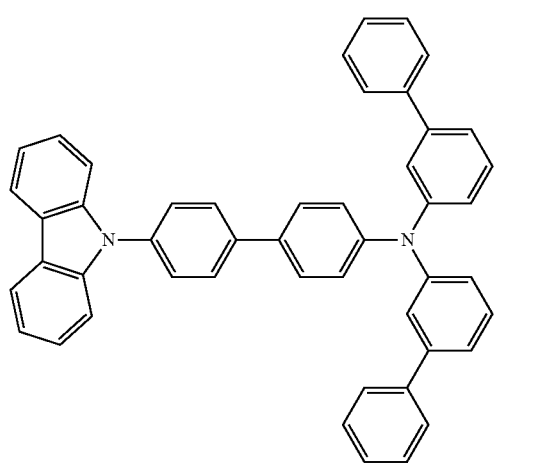
HT10
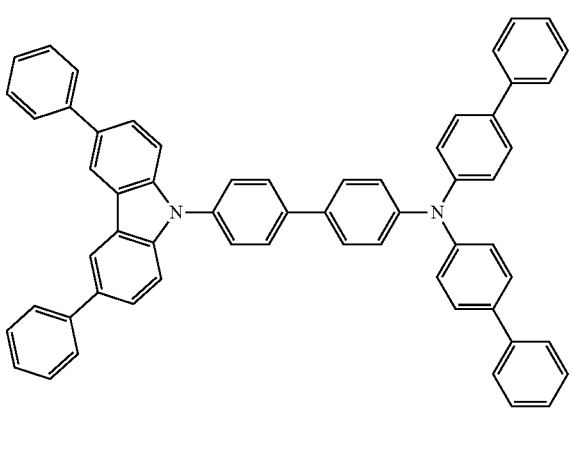
HT11
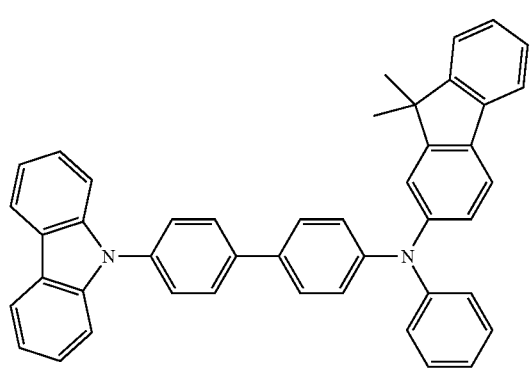
HT12
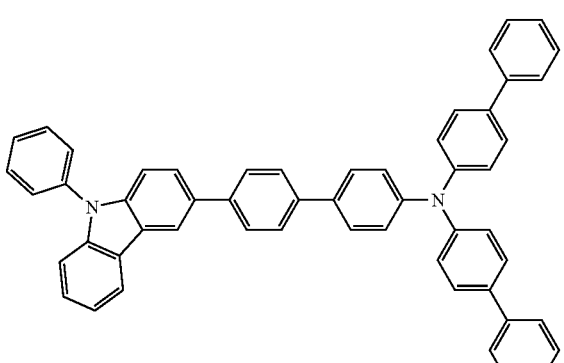

-continued
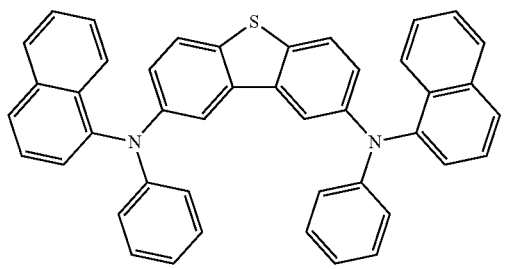
HT13
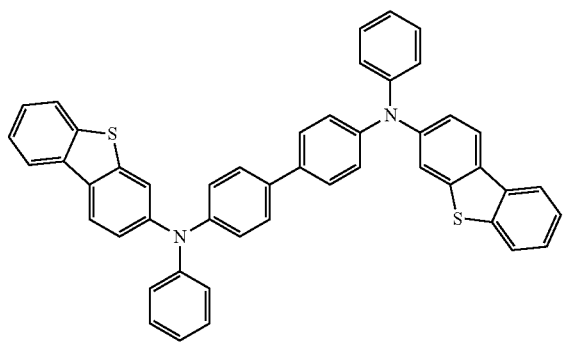
HT14
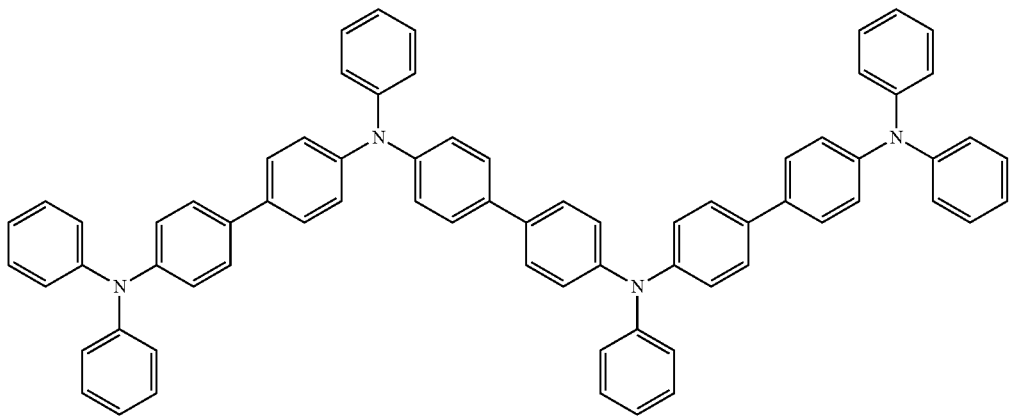
HT15
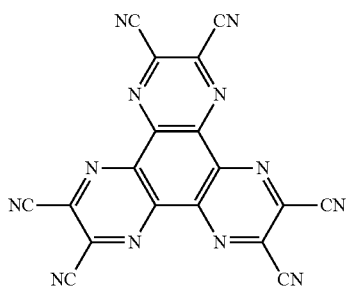
HT16
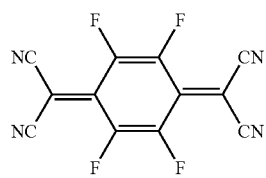
HT17
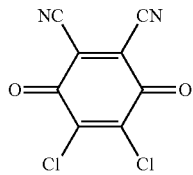
HT18
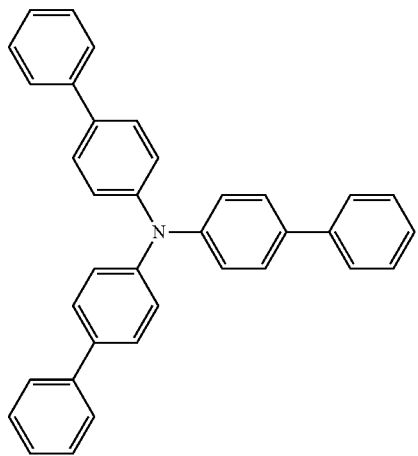
HT19

The hole injection layer may contain a compound having a deep LUMO energy level, such as hexaazatriphenylene, tetrafluoroquinodimethane, or dichlorodicyanobenzoquinone. Examples of such a material include compounds HT16 to HT19.

The material used in the electron blocking layer may be a compound including a carbazole structure, such as HT7, HT8, HT9, HT10, HT11, or HT12. Compounds having a carbazole group have a deep HOMO level and enable the formation of a structure in which the HOMO levels of the hole transporting material, the hole-blocking material and the luminescent layers become gradually deeper, thus enabling holes to be injected to the luminescent layers at a low voltage.

The material used in the electron transport layer may be selected from the compounds capable of transporting electrons injected from the cathode to the luminescent layers in view of the balance with the hole mobility of the hole-transporting material. Such a material may also be used in the hole blocking layer and the electron injection layer. Electron transporting materials include oxadiazole derivatives, oxazole derivatives, pyrazine derivatives, triazole derivatives, triazine derivatives, quinoline derivatives, quinoxaline derivatives, phenanthroline derivatives, organic aluminum complexes, and condensed ring compounds (such as fluorene derivatives, naphthalene derivatives, chrysene derivatives, and anthracene derivatives). The electron transporting material may also be used in the hole blocking layer.

ET1 to ET23 are materials that can be used in the electron transport layer 5, but the material of the electron transport layer is not limited to these.

ET1

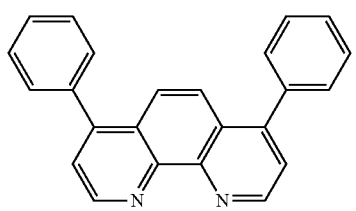

ET2

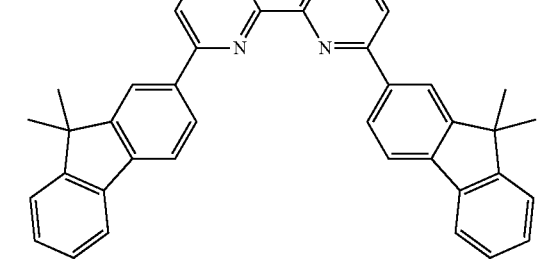

ET3

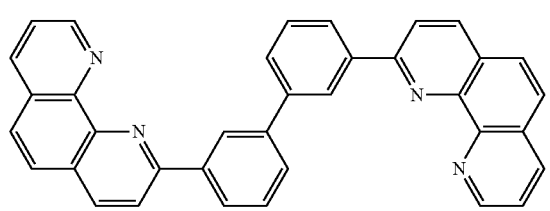

ET4

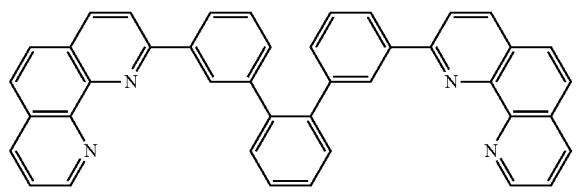

ET5

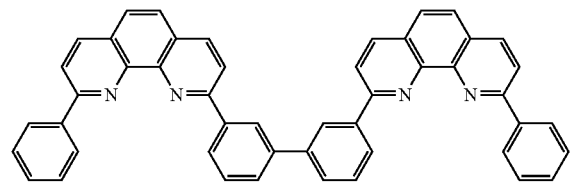

ET6

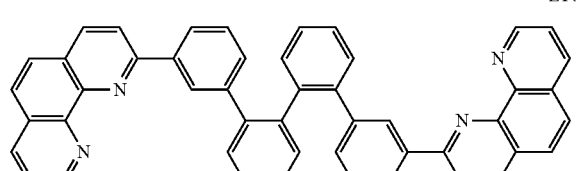

ET7

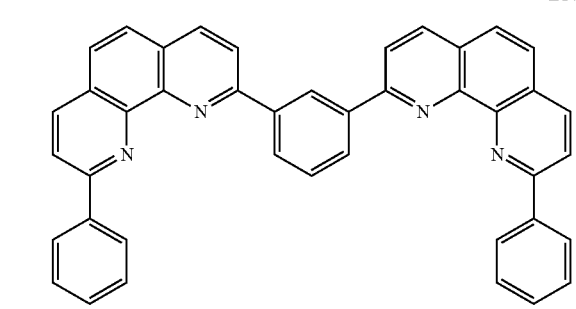

ET8

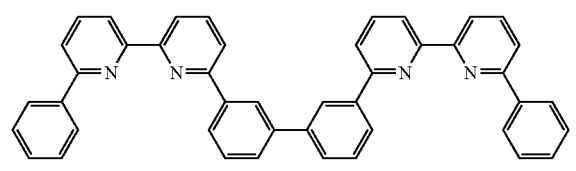

ET9

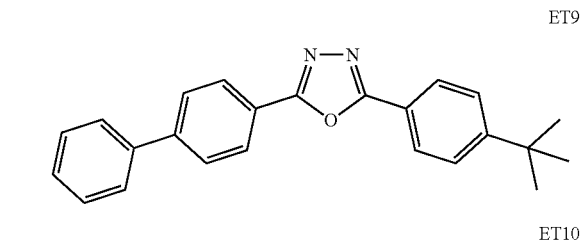

ET10

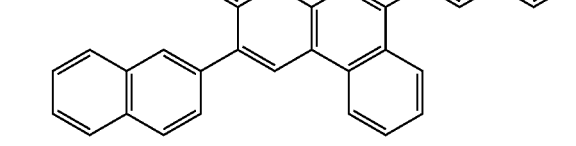

ET11
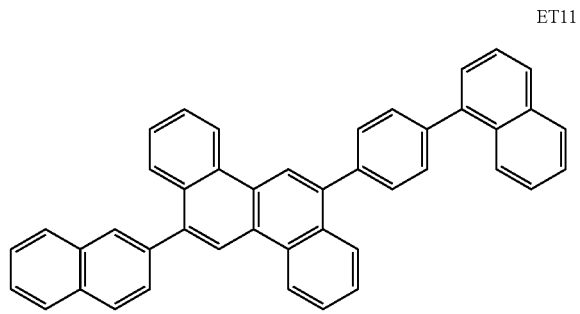
ET12
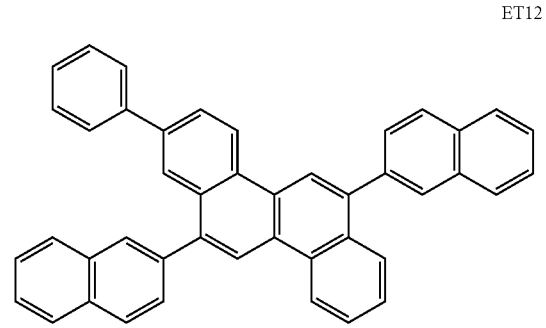
ET13
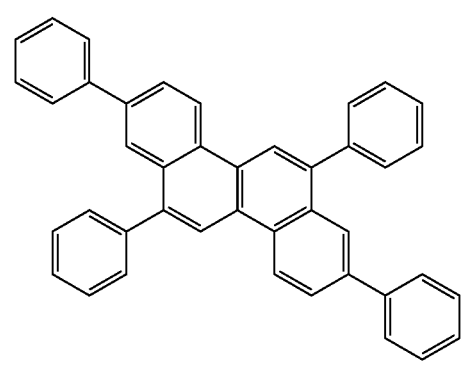
ET14
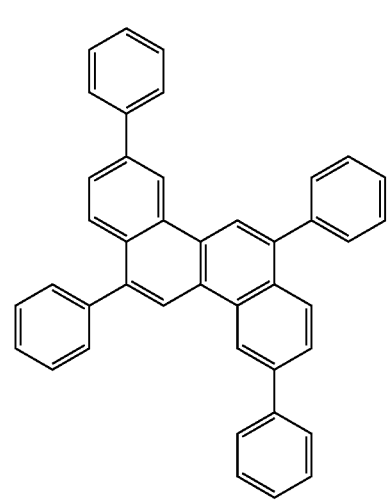
ET15
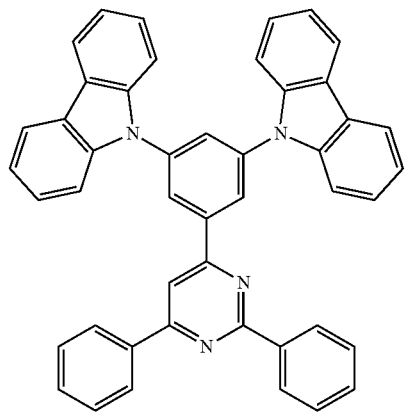
ET16
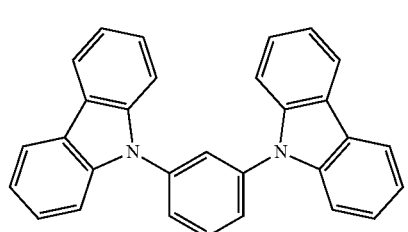
ET17
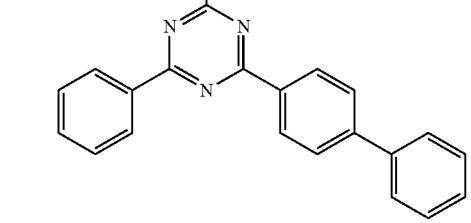
ET18
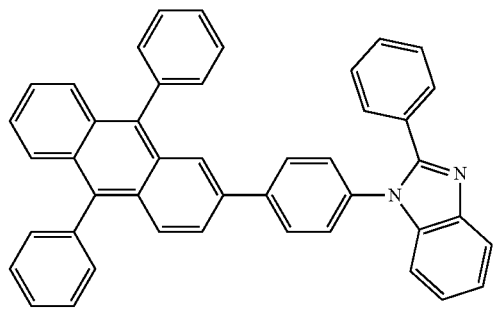

ET19

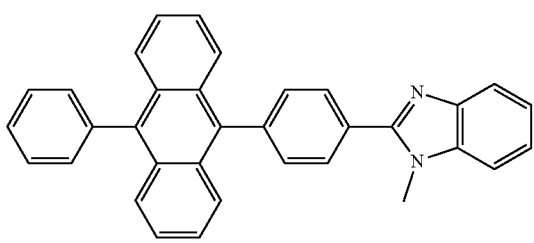

ET20

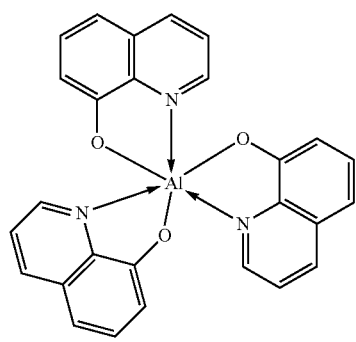

ET21

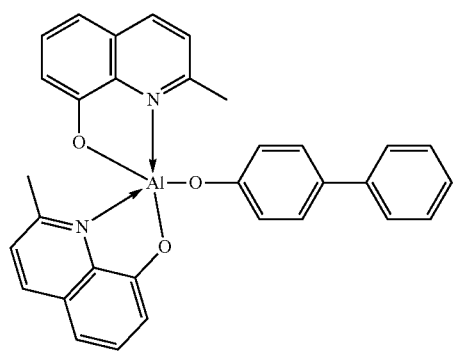

ET22

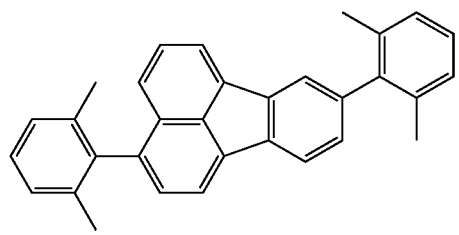

ET23

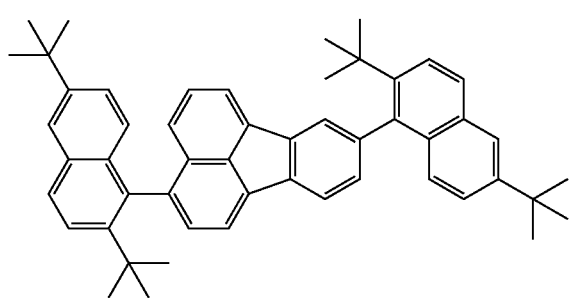

Hydrocarbons of the above-exemplified electron transporting materials may be used as a hole blocking material from the viewpoint of binding stability.

From the viewpoint of transporting electrons, a compound including at least one phenanthroline group, such as ET1, ET2, ET3, ET4, ET5, ET6, or ET7 may be used. Such a material can interact with electron injecting materials, such as alkali metal compounds, and electrode materials to reduce the electron injection barrier.

In an embodiment, the electron injection layer may contain both an electron-donating dopant and an electron transporting material. The electron-donating dopant may be an alkali metal, an alkaline-earth metal, a rare earth metal, or a compound of such a metal. In this instance, the electron injection layer may be formed by adding 0.1% to 25% by weight of an alkali metal compound into an electron transporting material. In some embodiments, the alkali metal compound may be a cesium compound. The cesium compound may be cesium carbonate or a compound derived from cesium carbonate.

In some embodiments, the electron injection layer may be formed by codeposition of cesium carbonate and an electron transporting material. From the viewpoint of ensuring high electron injection performance, the thickness of the electron injection layer may be 10 nm to 100 nm. During codeposition, cesium carbonate may be decomposed and converted into suboxides, such as $(Cs_{11}O_3)Cs_{10}$, $(Cs_{11}O_3)Cs$, and $Cs_{11}O_3$ in the electron injection layer. The cesium and the organic compound (electron transporting material) may form a coordination compound.

The organic compound layers of the organic EL element of the present disclosure may be formed in a dry process performed by, for example, vacuum deposition, ionized deposition, sputtering, or using plasma. Alternatively, the organic compound layers may be formed in a wet process performed by a known coating method using a material dissolved in a solvent, such as spin coating, dipping, a cast method, Langmuir-Blodgett (LB) method, or an ink jet method.

Layers formed by vacuum deposition, solution coating, or the like are unlikely to crystallize and are thus stable over time. If an organic compound layer is formed by coating, an appropriate binder resin may be used in combination with the material of the layer.

Examples of the binder resin include, but are not limited to, polyvinylcarbazole resin, polycarbonate resin, polyester resin, ABS resin, acrylic resin, polyimide resin, phenol resin, epoxy resin, silicone resin, and urea resin.

Such a binder resin may be used in the form of homopolymer or copolymer as a single material, or may be used in combination in the form of a mixture. Other known additives, such as a plasticizer, an antioxidant, and an ultraviolet light adsorbent, may further be used, if necessary.

Protective Layer

The organic EL element of the present disclosure may include a protective layer. The protective layer is a layer of a material that is much poorly permeable to oxygen and water from the outside, such as a silicon nitride (SiN) or silicon nitroxide (SiON) layer formed by chemical vapor deposition (CVD), an aluminum oxide layer formed by atomic layer deposition (ALD), or a silicon oxide or titanium oxide layer. The protective layer may be defined by a single layer or a plurality of layers (multilayer structure) provided that it can sufficiently block water. The multilayer protective layer may be composed of layers made of different materials or layers made of the same material but varying in density. In some embodiments, the protective layer may be formed in view of refractive index so as to help the extraction of light from the organic EL element. The protective layer may be called a sealing layer. The thickness of the protective layer may be, but is not limited to, 1.6 μm to 3.0 μm or 2.0 μm to 2.8 μm.

Planarizing Layer

The organic EL element may further include a planarizing layer covering the uneven or rough surface of the protective layer. Therefore, in at least some embodiments, the protective layer is formed over the surface of the protective layer. Thus, the planarizing layer prevents the protective layer from scattering light at the slants of the uneven surface thereof, suppressing mixing colors. The planarizing layer may be defined by a resin layer formed by coating.

Color Filter

The organic EL element may further include a color filter. The color filter may be formed by applying a color resist onto the planarizing layer and patterning the color resist by lithography. The color resist contains, for example, a photo-curable resin, and portions thereof irradiated with ultraviolet light or the like are cured, thus forming a pattern. The negative/positive mechanism of curing with ultraviolet light may be reversed.

In an embodiment, the color filter may include R, G, and B color filters. The R, G, and B color filters may be arranged in a striped array, a square array, a delta array, or a Bayer array.

Filling Layer

The organic EL element may further include a filling layer between the color filter and an opposing substrate. The filling layer may be made of an organic material such as acrylic resin, epoxy resin, or silicone resin. The filling layer and the color filter may be separated by a planarizing layer disposed therebetween. This planarizing layer may be made of the same material as or a different material from the planarizing layer between the color filter and the protective layer. In some embodiments, the two planarizing layers are made of the same material. Use of the same material enhances the adhesion between the planarizing layers outside the display region.

Opposing Substrate

The organic EL element of the present disclosure may include another substrate (opposing substrate) opposite the above-described substrate. The opposing substrate may be transparent. The opposing substrate may be made of, for example, transparent glass, a transparent plastic, or the like.

The opposing substrate may contain a binder resin. Examples of the binder resin include, but are not limited to, polyvinylcarbazole resin, polycarbonate resin, polyester resin, ABS resin, acrylic resin, polyimide resin, phenol resin, epoxy resin, silicone resin, and urea resin. Such a binder resin may be used in the form of a homopolymer or copolymer, or in the form of a mixture. Other known additives, such as a plasticizer, an antioxidant, and an ultraviolet light adsorbent, may further be used, if necessary.

Applications of the Organic EL Element

The organic EL element of the present disclosure may be used in a display device or a lighting device. In addition, the organic EL element may be used as an exposure light source of an electrophotographic image forming apparatus, a backlight of a liquid crystal display device, or a light-emitting device including a white light source provided with a color filter. The color filter may transmit at least one of three colors: red, green, and blue.

The display device according to an embodiment of the present disclosure includes a plurality of pixels, and at least one of the pixels includes the organic EL element of the present disclosure. This pixel includes the organic EL element of the present disclosure and an active element. The active element may be a switching element or an amplifier element. More specifically, the active element may be a transistor. Either the anode or the cathode of the organic EL element is electrically coupled to either the drain electrode or the source electrode of the transistor. The transistor may contain an oxide semiconductor in the active region thereof. The oxide semiconductor may be amorphous or crystalline, or may contain amorphous phases and crystalline phases. If the oxide semiconductor is crystalline, the crystals may be monocrystalline or microcrystalline, or specific axes thereof, such as the C-axes, may be aligned. Crystals in two or more of these states may be mixed.

An organic EL device including such a switching element may be used as an image display device in which organic EL elements act as pixels, or may be used as a lighting device. Alternatively, the organic EL device may be used as an exposure light source of an electrophotographic image forming apparatus, such as a laser beam printer or a copy machine.

The display device may be used as an image display device of a PC, a smartphone, a digital camera, a portable game machine, or the like. The transistor may be a TFT element. The TFT element may be formed on the insulating surface of a substrate.

The display section of an imaging apparatus or an ink jet printer may have a function as a touch panel. The touch panel function may be operated by, but not limited to, using infrared, a capacitive scheme, a resistive film, or electromagnetic induction. In some embodiments, a capacitive scheme may be used. Also, the display device may be used as a display section of a multifunctional printer.

The lighting device illuminates, for example, a room. At least any one of the organic EL elements in the lighting device is the organic EL element of the present disclosure.

The display device according to an embodiment of the present disclosure includes a plurality of pixels, and at least one of the pixels includes the organic EL element of the present disclosure. This pixel includes the organic EL element of the present disclosure and an active element. The active element may be a switching element or an amplifier element. More specifically, the active element may be a transistor. Either the anode or the cathode of the organic EL element is electrically coupled to either the drain or the source electrode of the transistor. The transistor may contain an oxide semiconductor in the active region thereof. The oxide semiconductor may be amorphous or crystalline, or may contain amorphous phases and crystalline phases. If the oxide semiconductor is crystalline, the crystals may be monocrystalline or microcrystalline, or specific axes thereof, such as the C-axes, may be aligned. Crystals in two or more of these states may be mixed.

The display device according to an embodiment of the present disclosure will now be described with reference to a figure. FIG. 3 is a schematic sectional view of a display device including organic EL elements and TFT elements each connected to the corresponding organic EL element. The TFT elements are a type of active element.

The display device 10 shown in FIG. 3 includes a substrate 11 made of glass or the like, and a moisture-proof film 12 over the substrate to protect TFT elements or organic compound layers. Reference numeral 13 designates a metal gate electrode 13. Reference numeral 14 designates a gate insulating film, and reference numeral 15 designates a semiconductor layer.

Each TFT element 18 includes the semiconductor layer 15, a drain electrode 16, and a source electrode 17. An insulating film 19 is disposed over the TFT elements 18. Each source electrode 17 is connected to the anode 21 of the corresponding organic EL element through a contact hole 20.

The electrical coupling from the electrode (anode or cathode) of the organic EL element to the electrode (source electrode or drain electrode) of the TFT is not limited to the manner shown in FIG. 3. In other words, either the anode 21 or the cathode 23 of the organic EL element is electrically coupled to either the source electrode 17 or the drain electrode 16 of the TFT element 18.

Although the display device 10 shown in FIG. 3 is illustrated as if it had a single organic compound layer, the organic compound layer 22 may have a plurality of layers. Furthermore, the cathode 23 is provided thereover with a first protective layer 24 and a second protective layer 25 to suppress the deterioration of the organic EL element.

Although the display device 10 shown in FIG. 3 includes transistors as switching elements, metal-insulator-metal (MIM) elements may be used as the switching elements instead of the transistors.

Each transistors of the display device 10 shown in FIG. 3 is not limited to the transistor formed in a monocrystalline silicon wafer and may be a thin film transistor including an active layer on the insulating surface of a substrate. The active layer of the thin film transistor may be made of monocrystalline silicon, non-monocrystalline silicon, such as amorphous silicon or microcrystalline silicon, or a non-monocrystalline oxide semiconductor, such as indium zinc oxide or indium gallium zinc oxide. A thin film transistor is referred to as a TFT element.

The transistors in the display device 10 shown in FIG. 3 may be formed in the substrate that may be made of Si. To be formed in the substrate implies that the transistors are formed by working the substrate. In other words, a transistor formed in a substrate implies that the substrate and the transistor are formed in one body.

It depends on the definition of the display device whether the transistors are formed in the substrate. For example, for a display device having a definition of a QVGA level for 1 inch, transistors may be formed in a Si substrate.

Figure 4:
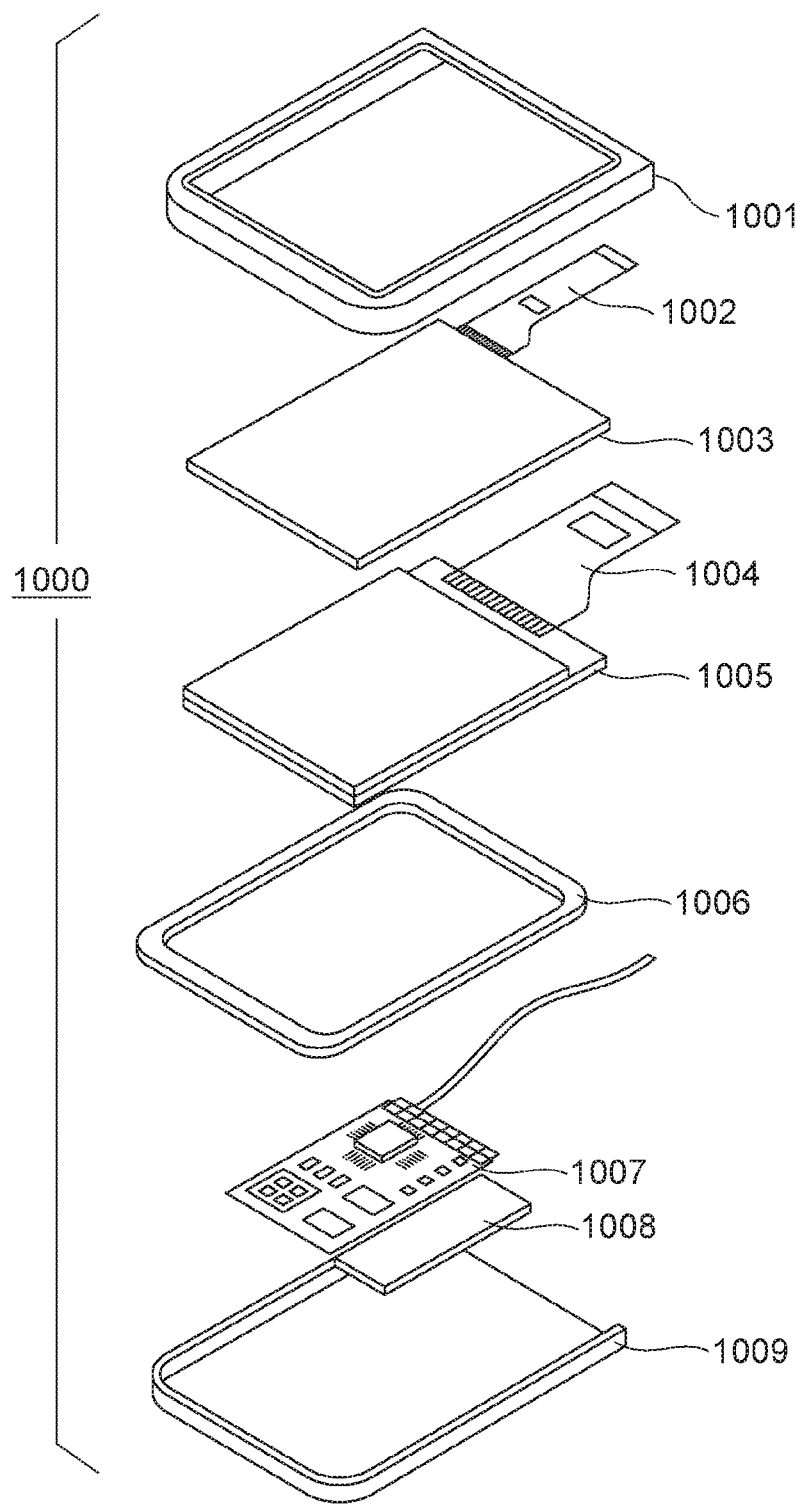
FIG. 4 is a schematic view of a display device according to an embodiment of the present disclosure.

FIG. 4 is a schematic illustrative representation of a display device according to an embodiment of the present disclosure. The display device 1000 may include a touch panel 1003, a display panel 1005, a frame 1006, a circuit board 1007 and a battery 1008 between an upper cover 1001 and a lower cover 1009. The touch panel 1003 and the display panel 1005 are connected to flexible printed circuits (FPCs) 1002 and 1004, respectively. Transistors are printed on the circuit board 1007. The battery 1008 is not necessarily provided unless the display device is for mobile use, and the position of the battery is not limited to the position shown in the figure even for mobile use.

In an embodiment, the display device of the present disclosure may be used as a display section of an imaging apparatus including an optical section having a plurality of lenses and an imaging element capable of receiving light that has passed through the optical system. The display section of the imaging apparatus may be used to display information obtained by the imaging element. The display section may be exposed to the outside of the imaging apparatus or may be disposed within a viewfinder. The imaging apparatus may be a digital camera or a digital video camera.

Figure 5:
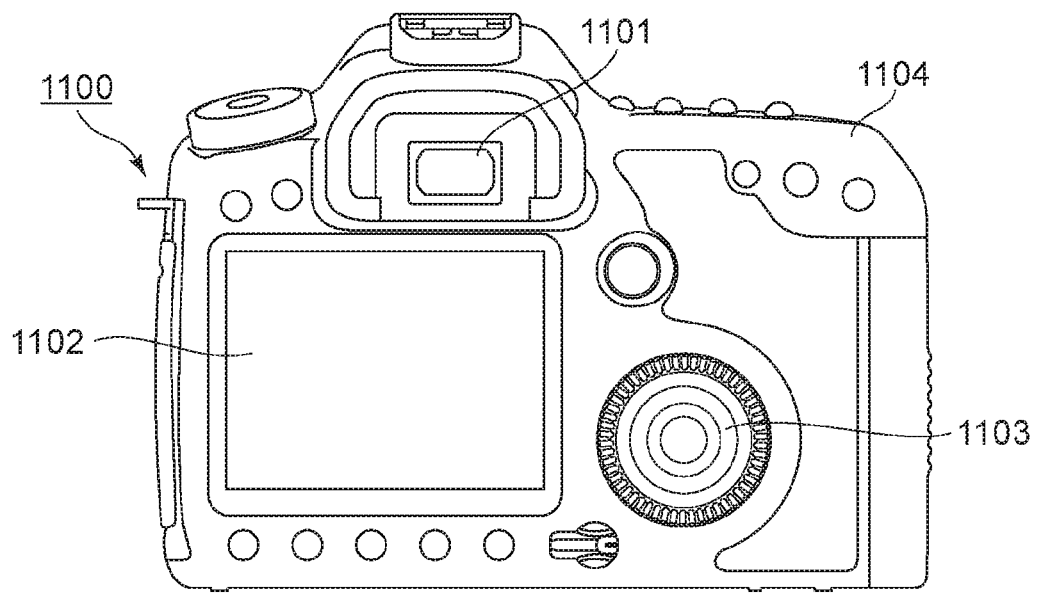
FIG. 5 is a schematic view of an imaging apparatus according to an embodiment of the present disclosure.

FIG. 5 is a schematic view of an imaging apparatus according to an embodiment of the present disclosure. The imaging apparatus 1100 may include a viewfinder 1101, a rear display 1102, a housing 1103, and an operational section 1104. The viewfinder 1101 may include the display device according to an embodiment of the present disclosure. In this instance, the display device may display not only taken images but also environmental information, imaging instructions, or the like. The environmental information may include, for example, the intensity and the direction of external light, the moving speed of a subject to be taken, and the possibility that the subject is hidden by an object.

Since the appropriate timing for taking an image is a very short period of time, it is desirable to display information as quickly as possible. In this viewpoint, it is beneficial that the display device includes the organic EL elements according to an embodiment of the present disclosure. The organic EL element of the present disclosure responds quickly. Such a display device is more suitable than liquid crystal display devices for use in apparatuses required to display information quickly.

The imaging apparatus 1100 includes an optical system (not shown). The optical system includes a plurality of lenses and forms an image on the imaging element in the housing 1103. The focus can be adjusted by adjusting the relative positions of the plurality of lenses. This may be automatically performed.

In an embodiment, the display device may include red, green, and blue color filters. The red, green, and blue color filters may be arranged in a delta array.

In an embodiment, the display device of the present disclosure may be used in the display section of a mobile terminal. In this instance, the display section may have both a displaying function and an operational function. The mobile terminal may be a cellular phone, such as a smartphone, a tablet PC, a head-mounted display, or the like.

Figure 6:
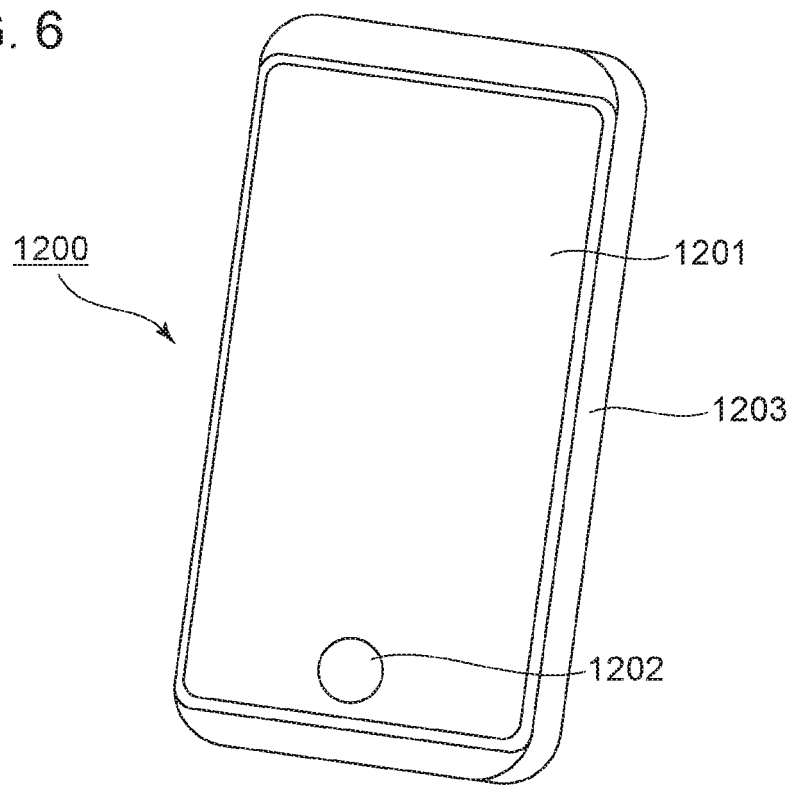
FIG. 6 is a schematic view of an electronic apparatus according to an embodiment of the present disclosure.

FIG. 6 is a schematic view of a mobile apparatus according to an embodiment of the present disclosure. The mobile apparatus 1200 includes a display section 1201, an operational section 1202, and a housing 1203. The housing 1203 contains a circuit, a printed board having the circuit, a battery, and a communication section. The operational section 1202 may be a button or a touch panel responder. The operational section 1202 may have a biometrically authenticating function of recognizing the fingerprint and releasing the lock. An electronic apparatus including a communication section may be referred to as a communication apparatus.

Figure 7A:
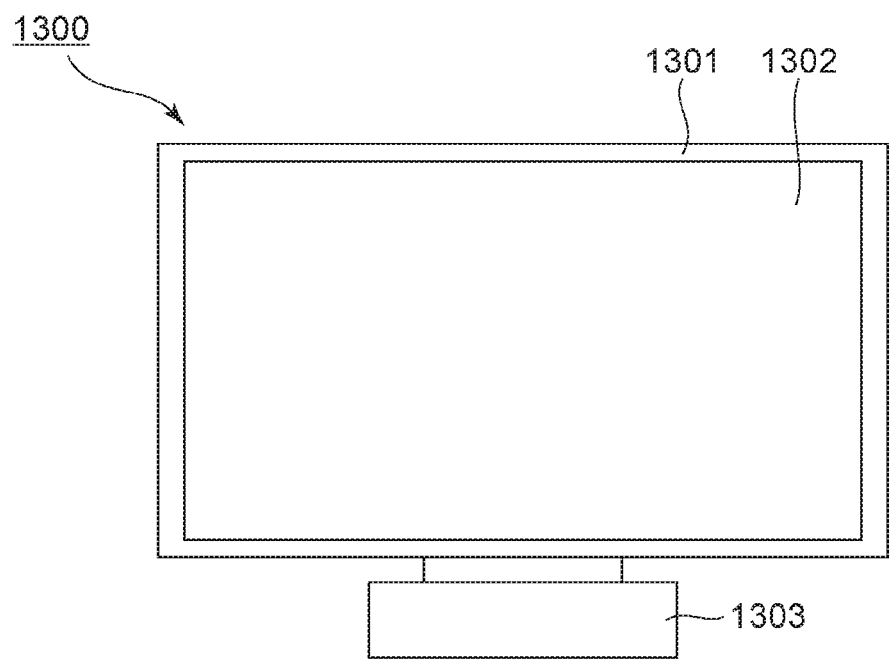
FIG. 7A is a schematic view of a display device according to an embodiment of the present disclosure.
Figure 7B:
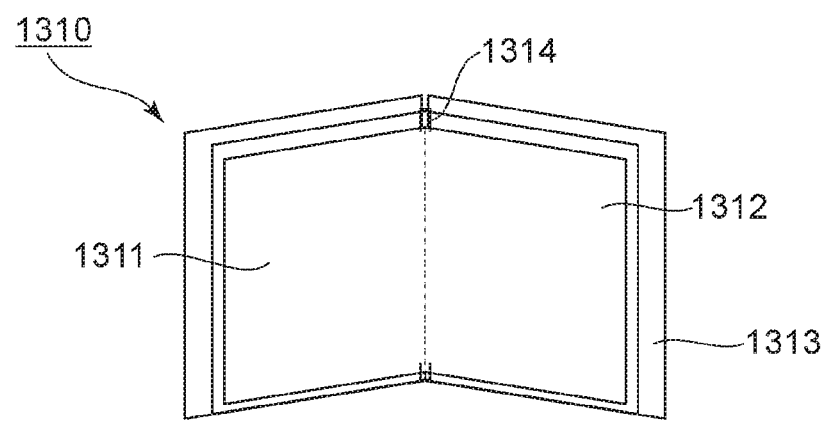
FIG. 7B is a schematic view of a foldable display device according to an embodiment of the present disclosure.

FIGS. 7A and 7B are each a schematic illustrative representation of a display device according to an embodiment of the present disclosure. FIG. 7A shows a display device used as a TV monitor or a PC monitor. This display device 1300 includes a frame 1301 and a display section 1302. The display section 1302 may include the organic EL elements according to an embodiment of the present disclosure.

The display device also includes a base 1303 supporting the frame 1301 and the display section 1302. The base 1303 is not limited to the form shown in FIG. 7A. Alternatively, the lower side of the frame 1301 may serve as the base.

The frame 1301 and the display section 1302 may be curved. The radius of curvature thereof may be in the range of 5000 mm to 6000 mm.

FIG. 7B is a schematic illustrative representation of a display device according to another embodiment of the present disclosure. The display device 1310 shown in FIG. 7B is a foldable display device. The display device 1310 includes a first display section 1311, a second display section 1312, and a housing 1313 and has a folding line 1314. The first display section 1311 and the second display section 1312 each may include the organic EL elements according to an embodiment of the present disclosure. The first display section 1311 and the second display section 1312 may be continuous without being separated by a joint. The first display section 1311 and the second display section 1312 may be separated from each other along the folding line 1314. The first display section 1311 and the second display section 1312 may display different images from each other, or a single image may be displayed on a set of the first and second display sections.

Figure 8:
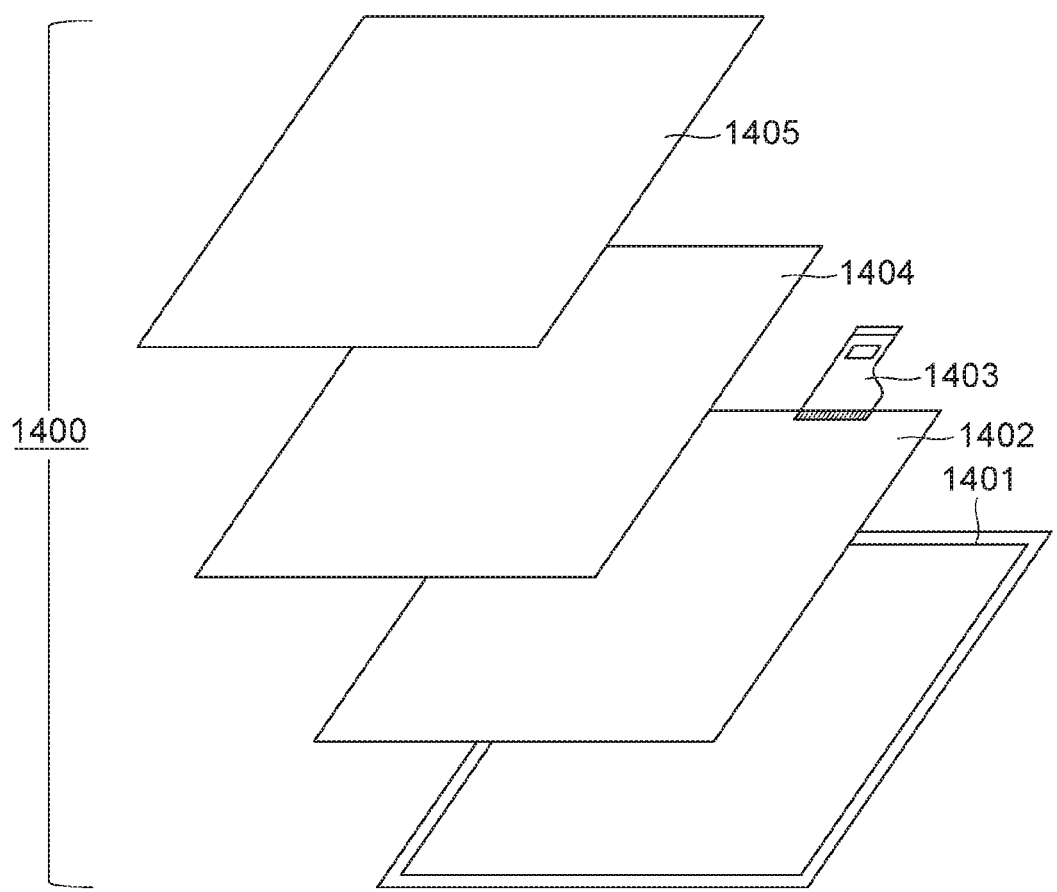
FIG. 8 is a schematic representation of a lighting device according to an embodiment of the present disclosure.

FIG. 8 is a schematic illustrative representation of a lighting device according to an embodiment of the present disclosure. The lighting device 1400 may include a housing 1401, a light source 1402, a circuit board 1403, an optical film 1404, and a light diffusing section 1405. The circuit board 1403, the optical film 1404, and the light diffusing section 1405 may be disposed on the light emitting side of the light source 1402. The light source 1402 may include the organic EL element according to an embodiment of the present disclosure. The optical filter 1404 may be intended to improve the color rendering properties of the light source 1402. The light diffusing section 1405 diffuses light emitted from the light source 1402 effectively and helps the light reach a wide region for, for example, lighting up. A cover may be provided at an outermost portion.

The lighting device illuminates, for example, a room. The lighting device may emit light of cool white, sunshine color, or any other color from blue to red. The lighting device may include a dimmer circuit that dims the light. The lighting device may include the organic EL element according to an embodiment of the present disclosure and a power supply circuit connected to the organic EL element. The power supply circuit converts alternating voltage to direct voltage. Cool white has a color temperature of 4200 K and sunshine color has a color temperature of 5000 K. The lighting device may include a color filter.

The lighting device may include a heat radiation section. The heat radiation section is intended to dissipate heat from the device and may be made of, for example, a metal having a high specific heat or liquid silicon.

Figure 9:
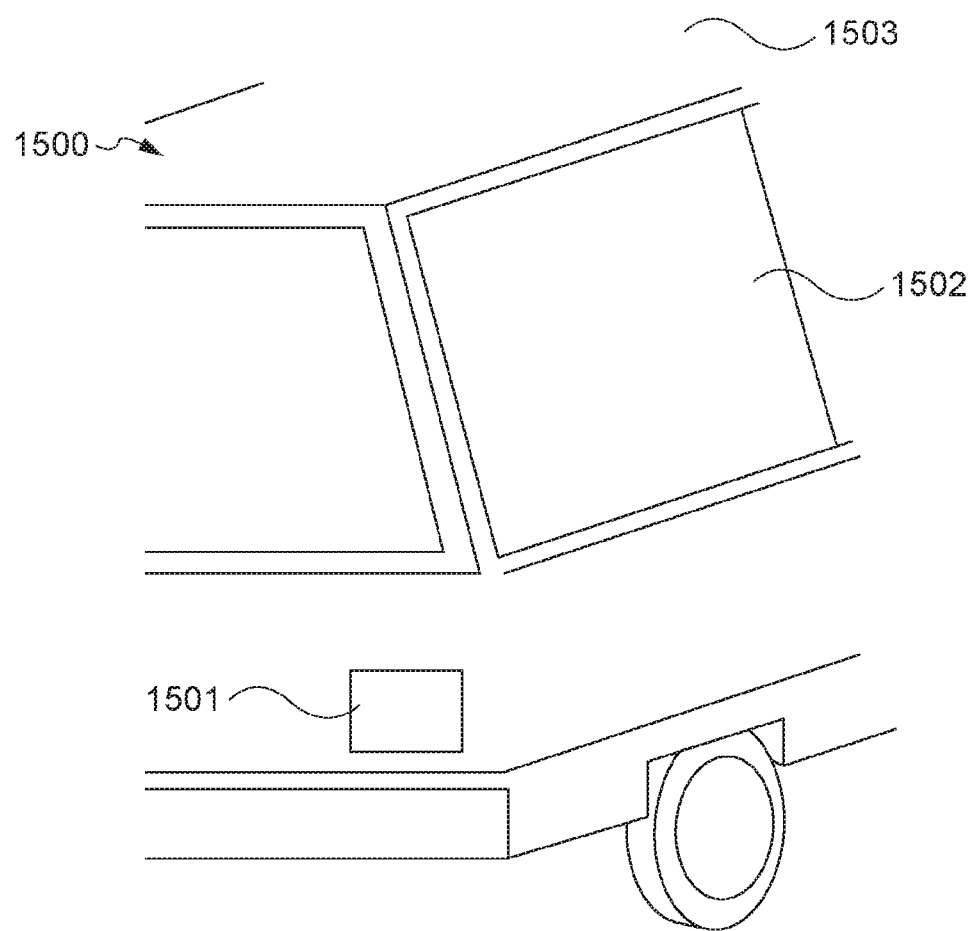
FIG. 9 is a schematic view of an automobile including a vehicle lamp that is an implementation of an aspect of the present disclosure.

FIG. 9 is a schematic view of an automobile including a tail lamp that is an implementation of the lighting device according to an embodiment of the present disclosure. The automobile 1500 has a tail lamp, and the tail lamp 1501 may light when the breaks are applied.

The tail lamp 1501 may include the organic EL element according to an embodiment of the present disclosure. The tail lamp 1501 may include a protective member that protects the organic EL element. The protective member may be made of any material provided that it has a strength to some extent and is transparent. In some embodiments, the protective member may be made of polycarbonate or the like. The polycarbonate may be mixed with a furandicarboxylic acid derivative, an acrylonitrile derivative, or the like.

The automobile 1500 may include a car body 1503 and a window 1502 attached to the car body 1503. The window 1502 may be a transparent display unless it is intended for checking of the front and rear of the automobile. The transparent display may include the organic EL element according to an embodiment of the present disclosure. In this instance, the members such as electrodes of the organic EL element are made of a transparent material.

The automobile disclosed herein is an implementation of the movable body according to an embodiment of the present disclosure. The movable body may be a drone or a ship. The drone, the ship, or the like may include an enclosure and a lamp provided for the enclosure. The lamp may emit light to provide a notification of the position of the enclosure.

In an embodiment, the organic EL element may be used for displaying an image. In this instance, the emission from the organic EL element has a luminance that is controlled by a TFT, or switching element, and a plurality of such organic EL elements are arranged in a plane so that an image is displayed with several emission luminances of the organic EL elements. The TFT may be replaced with any other switching element, such as a transistor, a MIM element, or an active matrix driver formed on or in a substrate, such as a silicon substrate. Whether on a substrate or in a substrate depends on definition. For example, for a definition of a QVGA level for 1 inch, the organic EL elements may be disposed on a silicon substrate. The display device including the organic EL elements according to an embodiment of the present disclosure is operable to display high-quality images over a long time.

EXAMPLES

Example 1

Measurement of HOMO and LUMO Energies

Host materials and dopants were analyzed as described below. The results are shown in Table 2.
(A) Measurement of HOMO Energy A 30 nm-thick thin film of a material was formed on an aluminum substrate, and the HOMO energy of the thin film was measured with an atmospheric photoelectron spectrometer AC-3 (manufactured by Riken Keiki).
(B) Measurement of LUMO Energy A 30 nm-thick thin film of a material was formed on a quartz substrate, and the optical band gap (absorption edges) of the thin film was measured with a spectrophotometer V-560 (manufactured by JASCO). The LUMO energy of the material is defined as the sum of the optical band gap obtained here and the foregoing HOMO energy. The results are shown in Table 2.

Table 2 also shows the values obtained by the molecular orbital calculation. Comparisons between the calculated values and the corresponding measured values show a correlation therebetween. Accordingly, the elements of the following Examples were evaluated by using calculated HOMO and LUMO energies.

TABLE 2

| | Compound | HOMO (eV) | LUMO (eV) | HOMO (eV) | LUMO (eV) |
|---|---|---|---|---|---|
| | | Measured value | | Calculated value | |
| Host | EM1 | −6.02 | −3.10 | −5.11 | −1.67 |
| | EM2 | −5.96 | −3.04 | −5.06 | −1.62 |
| | EM3 | −5.94 | −2.95 | −5.14 | −1.62 |
| | EM4 | −6.00 | −3.01 | −5.19 | −1.66 |
| | EM5 | −6.03 | −3.06 | −5.12 | −1.64 |
| | EM7 | −6.01 | −3.13 | −5.02 | −1.70 |
| | EM10 | −6.31 | −2.83 | −5.67 | −1.21 |
| | EM13 | −5.99 | −3.06 | −5.13 | −1.46 |
| | EM17 | −5.73 | −3.53 | −4.68 | −2.07 |
| | EM22 | −5.80 | −3.20 | −4.94 | −1.77 |
| | EM27 | −6.22 | −3.11 | −5.73 | −1.87 |
| Blue dopant | BD1 | −5.46 | −2.67 | −4.73 | −1.47 |
| | BD4 | −5.56 | −2.77 | −5.08 | −1.49 |
| | BD8 | −6.05 | −3.26 | −5.18 | −1.72 |
| | BD9 | −6.08 | −3.38 | −5.24 | −1.84 |
| | BD15 | −6.10 | −3.40 | −5.20 | −1.91 |
| | BD19 | −6.11 | −3.48 | −5.49 | −2.21 |
| | BD20 | −5.90 | −3.30 | −5.04 | −1.82 |
| | BD23 | −6.20 | −3.52 | −5.44 | −2.06 |
| | BD24 | −6.08 | −3.38 | −5.32 | −1.94 |
| | BD25 | −6.10 | −3.40 | −5.02 | −1.91 |
| Green dopant | GD3 | −5.40 | −2.60 | −4.74 | −1.83 |
| | GD4 | −5.58 | −3.03 | −4.70 | −1.85 |
| | GD7 | −5.77 | −3.57 | −5.00 | −1.97 |

TABLE 2-continued

|  | Compound | HOMO (eV) | LUMO (eV) | HOMO (eV) | LUMO (eV) |
|---|---|---|---|---|---|
|  | GD9 | −5.94 | −3.45 | −5.02 | −1.96 |
|  | GD10 | −5.87 | −3.49 | −5.01 | −1.98 |
|  | GD11 | −5.82 | −3.51 | −5.00 | −1.97 |
|  | GD22 | −5.90 | −3.40 | −5.02 | −2.06 |
|  | GD27 | −5.84 | −3.52 | −4.95 | −2.08 |
| Red dopant | RD2 | −5.40 | −3.30 | −4.65 | −2.30 |
|  | RD5 | −5.62 | −3.63 | −4.72 | −2.32 |
|  | RD10 | −5.60 | −3.55 | −4.78 | −2.37 |
|  | RD15 | −5.55 | −3.50 | −4.63 | −2.34 |
|  | RD21 | −5.65 | −3.61 | −4.87 | −2.52 |

Example 2

An organic EL element having a top emission structure was prepared which included an anode, a hole injection layer, a hole transport layer, an electron blocking layer, a first luminescent layer, a second luminescent layer, a third luminescent layer, a hole blocking layer, an electron transport layer, an electron injection layer, and a cathode, in this order, on a substrate.

The anode was formed by depositing Al (65 nm)/Ti (6 nm) on a glass substrate by sputtering and patterning the Al/Ti layer by photolithography. At this time, the area of the portion of the anode opposing the cathode was adjusted to 3 $mm^2$.

Subsequently, the substrate provided with the anode after being cleaned was placed in a vapor deposition apparatus (manufactured by ULVAC), which was then evacuated to $1.33 \times 10^{-4}$ Pa ($1 \times 10^{-6}$ Torr), and was subjected to UV/ozone cleaning. Then, the layers shown in Table 3 were formed. In this Example, host B is the first host material, and host A is the second host material.

TABLE 3

|  |  | Material |  | Thickness (nm) |
|---|---|---|---|---|
| Cathode |  | Mg:Ag = 1:1 |  | 10 |
| Electron injection layer |  | LiF |  | 1 |
| Electron transport layer |  | ET2 |  | 30 |
| Hole blocking layer |  | ET12 |  | 70 |
| Third luminescent layer | Host A | EM1 | Weight ratio | 8 |
|  | Green dopant | GD11 | EM1:BD11 = 99.4:0.6 |  |
| Second luminescent layer | Host A | EM1 | Weight ratio | 8 |
|  | Blue dopant | BD9 | EM1:BD9 = 99.4:0.6 |  |
| First luminescent layer | Host B | EM17 | Weight ratio | 7 |
|  | Red dopant | RD5 | EM17:RD5 = 96.5:0.4 |  |
| Electron blocking layer |  | HT7 |  | 10 |
| Hole transport layer |  | HT2 |  | 18 |
| Hole injection layer |  | HT16 |  | 7 |

Then, the resulting structure was placed in a glove box, which was purged with nitrogen, and sealed with a glass cover with a desiccant to yield an organic EL element.

The resulting organic EL element was connected to a voltage applying device for examination of properties. The current-voltage curve was obtained by measurement with an microammeter 4140B manufactured by Hewlett-Packard, and the chromaticity was measured with SR-3 manufactured by Topcon. The luminance of emitted light was measured with BM7 manufactured by Topcon. The organic EL element exhibited a high luminous efficiency of 4.3 cd/A at 1000 $cd/m^2$ display.

Examples 3 to 6, Comparative Examples 1 to 3

Organic EL elements were prepared in the same manner as in Example 2 except that the first luminescent layer, the second luminescent layer, and the third luminescent layer were each formed of the compound shown in Table 5.

The voltage of each element was measured at a current density 10 $mA/cm^2$. The voltage of the element in Example 2 was 3.5 V. The samples whose voltage was higher than the voltage in Example 1 by 0.5 V or more were evaluated as bad; the samples whose voltage was higher than in Example 1 by 0.2 V to less than 0.5 V were evaluated as fair; and the samples whose voltage was higher by less than 0.2 V were evaluated as good.

The emission spectra of the elements were measured at a current density 10 $mA/cm^2$. The peak height in the emission spectrum derived from the red dopant is defined as 1.0, and the peak heights derived from the blue dopant and the green dopant were measured with respect to the peak height of the red dopant. Peak heights of less than 0.5 were evaluated as bad; peak heights of 0.5 to less than 0.8 were evaluated as fair; and peak heights of 0.8 to less than 1.2 were evaluated as good. Also, peak heights of 1.2 to less than 1.5 were evaluated as fair, and peak heights of more than 1.5 were evaluated as bad. When the peak heights of blue and green emission are each at a level similar to the peak of red emission, good white-light emission can be produced.

The samples were further subjected to a continuous operation test at an initial luminance of 2000 $cd/m^2$, and the degradation in luminance after 100 hours was measured. Samples 20% or more degraded are evaluated as bad, samples degraded 10% to less than 20% are evaluated as fair, and samples degraded less than 10% are evaluated as good. The results are shown in Table 6.

Comparative Example 4

An organic EL element was prepared in the same manner as in Example 2 except that an intermediate layer shown in Table 4 was added and that the compositions of the first, the second, and the third luminescent layer were changed as shown in Table 4. Evaluation results are shown in Table 5.

TABLE 4

| | | Material | | Thickness (nm) |
|---|---|---|---|---|
| Cathode | | Mg:Ag = 1:1 | | 10 |
| Electron injection layer | | LiF | | 1 |
| Electron transport layer | | ET2 | | 30 |
| Hole blocking layer | | ET12 | | 70 |
| Third luminescent layer | Host A | EM5 | Weight ratio | 6 |
| | Green dopant | GD3 | EM5:GD3 = 99.4:0.6 | |
| Second luminescent layer | Host A | EM5 | Weight ratio | 6 |
| | Blue dopant | BD1 | EM5:BD1 = 99.4:0.6 | |
| Intermediate layer | | HT8 | | 6 |
| First luminescent layer | Host B | EM17 | Weight ratio | 5 |
| | Red dopant | RD5 | EM17:RD5 = 96.5:0.4 | |
| Electron blocking layer | | HT7 | | 10 |
| Hole transport layer | | HT2 | | 18 |
| Hole injection layer | | HT16 | | 7 |

Comparative Examples 5 and 6

Organic EL elements were prepared in the same manner as in Example 4 except that the first luminescent layer, the second luminescent layer, the third luminescent layer, and the intermediate layer were changed as shown in Table 5. The results are shown in Table 5.

TABLE 5

| | First luminescent layer | | | | Intermediate layer | | Second luminescent layer | | | |
|---|---|---|---|---|---|---|---|---|---|---|
| | Host | | Dopant | | Material | | Host | | Dopant | |
| | HOMO [eV] | LUMO [eV] | HOMO [eV] | LUMO [eV] | HOMO [eV] | LUMO [eV] | HOMO [eV] | LUMO [eV] | HOMO [eV] | LUMO [eV] |
| Example 2 | EM17 | | RD5 | | None | | EM1 | | BD9 | |
| | −4.68 | −2.07 | −4.72 | −2.37 | | | −5.11 | −1.67 | −5.24 | −1.84 |
| Example 3 | EM22 | | RD21 | | None | | EM1 | | BD23 | |
| | −4.98 | −1.77 | −4.63 | −2.24 | | | −5.11 | −1.67 | −5.44 | −2.06 |
| Example 4 | EM22 | | RD5 | | None | | EM4 | | BD11 | |
| | −4.98 | −1.77 | −4.72 | −2.37 | | | −5.19 | −1.66 | −5.24 | −1.84 |
| Example 5 | EM17 | | RD5 | | None | | EM11 | | BD9 | |
| | −4.68 | −2.07 | −4.72 | −2.37 | | | −5.15 | −1.67 | −5.44 | −2.06 |
| Example 6 | EM17 | | RD5 | | None | | EM5 | | BD1 | |
| | −4.68 | −2.07 | −4.72 | −2.37 | | | −5.12 | −1.64 | −4.73 | 1.47 |
| Comparative Example 1 | EM17 | | RD5 | | None | | EM5 | | GD3 | |
| | −4.68 | −2.07 | −4.72 | −2.37 | | | −5.12 | −1.64 | −4.74 | −1.83 |
| Comparative Example 2 | EM5 | | GD3 | | None | | EM17 | | RD5 | |
| | −5.12 | −1.64 | −4.74 | −1.83 | | | −4.68 | −2.07 | −4.72 | −2.37 |
| Comparative Example 3 | EM5 | | BD1 | | None | | EM5 | | GD3 | |
| | −5.12 | −1.64 | −4.73 | 1.47 | | | −5.12 | −1.64 | −4.74 | −1.83 |
| Comparative Example 4 | EM17 | | RD5 | | HT8 | | EM5 | | BD1 | |
| | −4.68 | −2.07 | −4.72 | −2.37 | −4.86 | −1.15 | −5.12 | −1.64 | −4.73 | 1.47 |
| Comparative Example 5 | EM17 | | RD5 | | HT8 | | EM5 | | BD9 | |
| | −4.68 | −2.07 | −4.72 | −2.37 | −4.86 | −1.15 | −5.12 | −1.64 | −5.24 | −1.84 |
| Comparative Example 6 | EM17 | | RD5 | | EM17 | | EM5 | | BD1 | |
| | −4.68 | −2.07 | −4.72 | −2.37 | −4.68 | −2.07 | −5.12 | −1.64 | −4.73 | 1.47 |

| | Third luminescent layer | | | | | | Peak height | |
|---|---|---|---|---|---|---|---|---|
| | Host | | Dopant | | | | | |
| | HOMO [eV] | LUMO [eV] | HOMO [eV] | LUMO [eV] | Luminance degradation | Voltage | Blue | Green |
| Example 2 | EM1 | | GD11 | | Good | Good | Good | Good |
| | −5.11 | −1.67 | −5.00 | −1.97 | | | | |
| Example 3 | EM1 | | GD11 | | Good | Good | Good | Good |
| | −5.11 | −1.67 | −5.00 | −1.97 | | | | |
| Example 4 | EM4 | | GD10 | | Good | Good | Good | Good |
| | −5.19 | −1.66 | −5.01 | −1.98 | | | | |
| Example 5 | EM11 | | GD10 | | Good | Good | Good | Good |
| | −5.15 | −1.67 | −5.01 | −1.98 | | | | |
| Example 6 | EM5 | | GD3 | | Fair | Good | Fair | Fair |
| | −5.12 | −1.64 | −4.74 | −1.83 | | | | |

TABLE 5-continued

| | Host | | Dopant | | | | | |
|---|---|---|---|---|---|---|---|---|
| Comparative Example 1 | EM5 -5.12 | -1.64 | BD1 -4.73 | -1.47 | Fair | Good | Bad | Bad |
| Comparative Example 2 | EM5 -5.12 | -1.64 | BD1 -4.73 | -1.47 | Bad | Bad | Bad | Bad |
| Comparative Example 3 | EM17 -4.68 | -2.07 | RD5 -4.72 | -2.37 | Fair | Fair | Bad | Fair |
| Comparative Example 4 | EM5 -5.12 | -1.64 | GD3 -4.74 | -1.83 | Bad | Bad | Fair | Fair |
| Comparative Example 5 | EM5 -5.12 | -1.64 | GD3 -4.74 | -1.83 | Bad | Bad | Fair | Fair |
| Comparative Example 6 | EM5 -5.12 | -1.64 | GD3 -4.74 | -1.83 | Bad | Fair | Fair | Bad |

The organic EL elements of Examples 1 to 6 exhibited low voltage, high durability, and good white-light emission in balance with constant red, green and blue emission peaks.

On the other hand, the element of Comparative Example 1, in which the luminescent layers were disposed in RGB order from the anode, did not sufficiently emit green and blue light due to optical interference and, exhibited white-light emission in poor balance in spite of low voltage.

In Comparative Example 2, white-light emission balance, voltage, and durability were not good. This is probably because the luminescent layers were disposed in GRB order from the anode. Since the host material of the R layer has a deep LUMO level and a shallow HOMO level, the R layer easily accumulates electrons and holes and, accordingly, a high voltage is required for charge injection into the adjacent layers. Consequently, luminous efficiencies of green and blue light were poor.

In Comparative Example 3, the luminous efficiency of blue light was poor, and white-light emission was not in balance. This is because the luminescent layers were disposed in BGR order from the anode. The injection barrier of electrons into the G layer is high due to the deep LUMO level of the host material of the R layer, and there is no injection barrier of holes into the R layer due to the shallow HOMO level of the host material of the R layer. The R layer thus easily accumulates electrons and holes. Consequently, the luminous efficiency of red light was high, while the luminous efficiencies of blue and green light were poor.

In Comparative Examples 4 and 5, while the luminescent layers were disposed in RBG order from the anode, the R layer and the B layer were separated by an intermediate layer disposed therebetween. This increases voltage and accordingly degrades the durability of the element. This is because the intermediate layer acts as an injection barrier of electrons from the B layer and an injection barrier of holes into the B layer.

The element of Comparative Example 6 had an intermediate layer as with the element of Comparative Example 4 but is different in that the intermediate layer was made of the same material as the host material of the R layer. The energy barrier thus is reduced compared to the element in Comparative Example 4, accordingly suppressing voltage increase. However, the voltage is still higher than the case of no intermediate layer, and holes are not sufficiently supplied to the blue and green layers. Consequently, the luminous efficiencies of blue and green light were poor, and white-light emission was not in balance.

The durability of the elements in Examples 1 to 5 was superior to that in Example 6. This is probably because the blue and green dopants used in Examples 1 to 5 did not have an amino group, and because the host materials are resistant to bond dissociation caused by exciton energy when charges are recombined, compared to the structure like anthracene in which three or more benzene rings are condensed in a straight line.

Examples 7 to 9

Organic EL elements were prepared in the same manner as in Example 2 except that the materials of the hole transport layer and the electron blocking layer were replaced with HT15 and HT10, respectively, and that the first luminescent layer, the second luminescent layer, and the third luminescent layer were each formed of the compound shown in Table 6.

Examples 10 to 12

Organic EL elements were prepared in the same manner as in Example 2 except that the material of the hole blocking layer was replaced with ET18, and that the first luminescent layer, the second luminescent layer, and the third luminescent layer were each formed of the compound shown in Table 6.

TABLE 6

| | First luminescent layer | | | | Intermediate layer | Second luminescent layer | | | |
|---|---|---|---|---|---|---|---|---|---|
| | Host | | Dopant | | Material | Host | | Dopant | |
| | HOMO [eV] | LUMO [eV] | HOMO [eV] | LUMO [eV] | HOMO [eV] / LUMO [eV] | HOMO [eV] | LUMO [eV] | HOMO [eV] | LUMO [eV] |
| Example 7 | EM17 -4.68 | -2.07 | RD2 -4.65 | -2.30 | None | EM1 -5.11 | -1.67 | BD9 -5.24 | -1.84 |
| Example 8 | EM17 -4.68 | -2.07 | RD5 -4.72 | -2.37 | None | EM11 -5.15 | -1.67 | BD9 -5.24 | -1.84 |
| Example 9 | EM22 -4.98 | -1.77 | RD21 -4.63 | -2.24 | None | EM11 -5.15 | -1.67 | BD23 -5.44 | -2.06 |
| Example 10 | EM22 -4.98 | -1.77 | RD5 -4.72 | -2.37 | None | EM1 -5.11 | -1.67 | BD23 -5.44 | -2.06 |

TABLE 6-continued

| | | | | | | | | | |
|---|---|---|---|---|---|---|---|---|---|
| Example 11 | EM17 | | RD5 | | None | EM11 | | BD9 | |
| | −4.68 | −2.07 | −4.72 | −2.37 | | −5.15 | −1.67 | −5.44 | −2.06 |
| Example 12 | EM17 | | RD5 | | None | EM5 | | BD1 | |
| | −4.68 | −2.07 | −4.72 | −2.37 | | −5.12 | −1.64 | −4.73 | −1.47 |

| | Third luminescent layer | | | | | | | |
|---|---|---|---|---|---|---|---|---|
| | Host | | Dopant | | | | Peak height | |
| | HOMO [eV] | LUMO [eV] | HOMO [eV] | LUMO [eV] | Luminance degradation | Voltage | Blue | Green |
| Example 7 | EM1 | | GD11 | | Fair | Good | Good | Good |
| | −5.11 | −1.67 | −5.00 | −1.97 | | | | |
| Example 8 | EM11 | | GD10 | | Good | Good | Good | Good |
| | −5.15 | −1.67 | −5.01 | −1.98 | | | | |
| Example 9 | EM11 | | GD10 | | Good | Good | Good | Good |
| | −5.15 | −1.67 | −5.01 | −1.98 | | | | |
| Example 10 | EM1 | | GD27 | | Good | Good | Good | Good |
| | −5.11 | −1.67 | −4.95 | −2.08 | | | | |
| Example 11 | EM11 | | GD10 | | Good | Good | Good | Good |
| | −5.15 | −1.67 | −5.01 | −1.98 | | | | |
| Example 12 | EM5 | | GD3 | | Fair | Good | Good | Good |
| | −5.12 | −1.64 | −4.74 | −1.83 | | | | |

The organic EL elements of Examples 7 to 12 exhibited low voltage, high durability, and good white-light emission in balance with constant red, green and blue emission peaks.

The organic EL element of the present disclosure includes three luminescent layers disposed in a specific order and in which the second and the third luminescent layer contain the same host material. Such an organic EL element has a long life and can operate at a low voltage and emit white light in balance.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-085874 filed Apr. 26, 2018, which is hereby incorporated by reference herein in its entirety.

What is claimed is:

1. An organic EL element comprising, in the following order:
   a first electrode;
   a first luminescent layer containing a red dopant and a first host material;
   a second luminescent layer in contact with the first luminescent layer, the second luminescent layer containing a blue dopant and a second host material different from the first host material;
   a third luminescent layer in contact with the second luminescent layer, the third luminescent layer containing a green dopant and the second host material; and
   a second electrode;
   wherein the first host material and the second host material satisfy the following relationship:
   LUMO(second host)>LUMO(first host),
   where LUMO(second host) represents the lowest unoccupied molecular orbital (LUMO) energy of the second host material, and LUMO(first host) represents the LUMO energy of the first host material.

2. The organic EL element according to claim 1, wherein the first host material and the second host material satisfy the following relationships:
   HOMO(second host)<HOMO(first host),
   where HOMO(second host) represents the highest occupied molecular orbital (HOMO) energy of the second host material, and HOMO(first host) represents the HOMO energy of the first host material.

3. The organic EL element according to claim 1, wherein the dopants and the host materials satisfy the following relationships:
   (LUMO(blue dopant)−LUMO(second host))>(HOMO(blue dopant)−HOMO(second host)); and
   (LUMO(green dopant)−LUMO(second host))>(HOMO(green dopant)−HOMO(second host)),
   where LUMO(blue dopant) represents the LUMO energy of the blue dopant, HOMO(blue dopant) represents the HOMO energy of the blue dopant, LUMO(green dopant) represents the LUMO energy of the green dopant, HOMO(green dopant) represents the HOMO energy of the green dopant, LUMO(second host) represents the LUMO energy of the second host material, and HOMO(second host) represents the HOMO energy of the second host material.

4. The organic EL element according to claim 1, wherein the red dopant and the first host material satisfy the following relationship:
   (LUMO(red dopant)−LUMO(first host))>(HOMO(red dopant)−HOMO(first host)),
   where LUMO(red dopant) represents the LUMO energy of the red dopant, HOMO(red dopant) represents the HOMO energy of the red dopant, LUMO(first host) represents the LUMO energy of the first host material, and HOMO(first host) represents the HOMO energy of the first host material.

5. The organic EL element according to claim 1, wherein at least one of the blue dopant, the green dopant, and the red dopant comprises a condensed ring including a 5-membered ring.

6. The organic EL element according to claim 1, wherein the first host material and the second host material each consist of a hydrocarbon.

7. The organic EL element according to claim 1, wherein the first host material and the second host material are each an organic compound comprising an aromatic hydrocarbon that optionally have an alkyl group having a carbon number of 1 to 12, the aromatic hydrocarbon being selected from the group consisting of benzene, naphthalene, fluorene, phenanthrene, chrysene, triphenylene, pyrene, fluoranthene, and benzofluoranthene.

8. The organic EL element according to claim 1, further comprising an organic compound layer in contact with the third luminescent layer between the third luminescent layer and the second electrode, the organic compound layer consisting of a hydrocarbon.

9. The organic EL element according to claim 1, further comprising an organic compound layer in contact with the first electrode between the first luminescent layer and the first electrode, the organic compound layer containing a material having a carbazole structure.

10. The organic EL element according to claim 1, wherein the second electrode transmits light and has a distance from the first electrode, and wherein emission from at least one of the first, the second, and the third luminescent layer is enhanced as a result of the distance between the first electrode and the second electrode.

11. The organic EL element according to claim 10, wherein the first electrode is reflective and acts as an anode, and the second electrode acts as a cathode.

12. A display device comprising:
a plurality of pixels, at least one of the pixels including the organic EL element as set forth in claim 1 and an active element connected to the organic EL element.

13. The display device according to claim 12, further comprising a color filter having red regions capable of transmitting red light, blue regions capable of transmitting blue light, and green regions capable of transmitting green light, the red, the blue, and the green regions being arranged in a delta array or a striped array.

14. An imaging apparatus comprising:
an optical section including a plurality of lenses;
an imaging element operable to receive light that has passed through the optical section; and
a display section on which imagery taken by the imaging element is displayed, the display section including the display device as set forth in claim claim 12.

15. An electronic apparatus comprising:
a housing;
a communication section operable to communicate with an external device; and
a display section being the display device as set forth in claim 12.

16. A lighting device comprising:
a light source being the organic EL element as set forth in claim 1; and
one of a light diffusing section and an optical film.

17. A movable body comprising:
an enclosure; and
a lamp attached to the enclosure, the lamp including the organic EL element as set forth in claim 1.

18. An organic EL element comprising, in the following order:
a first electrode;
a first luminescent layer containing a red dopant and a first host material;
a second luminescent layer in contact with the first luminescent layer, the second luminescent layer containing a blue dopant and a second host material different from the first host material;
a third luminescent layer in contact with the second luminescent layer, the third luminescent layer containing a green dopant and the second host material; and
a second electrode,
wherein the first host material and the second host material satisfy the following relationship:
HOMO(second host)<HOMO(first host),
where HOMO(second host) represents the highest occupied molecular orbital (HOMO) energy of the second host material, and HOMO(first host) represents the HOMO energy of the first host material.

19. A display device comprising:
a plurality of pixels, at least one of the pixels including the organic EL element as set forth in claim 18 and an active element connected to the organic EL element.

20. An organic EL element comprising, in the following order:
a first electrode;
a first luminescent layer containing a red dopant and a first host material;
a second luminescent layer containing a blue dopant and a second host material different from the first host material;
a third luminescent layer containing a green dopant and the second host material; and
a second electrode,
wherein the green dopant and the host material satisfy the following relationship:
LUMO(green dopant)−LUMO(second host))>(HOMO (green dopant)−HOMO(second host),
where LUMO(green dopant) represents the lowest unoccupied molecular orbital (LUMO) energy of the green dopant, HOMO(green dopant) represents the highest occupied molecular orbital (HOMO) energy of the green dopant, LUMO(second host) represents the LUMO energy of the second host material, and HOMO (second host) represents the HOMO energy of the second host material.

21. A display device comprising:
a plurality of pixels, at least one of the pixels including the organic EL element as set forth in claim 20 and an active element connected to the organic EL element.

* * * * *